United States Patent
Onuki

(10) Patent No.: US 12,261,180 B2
(45) Date of Patent: Mar. 25, 2025

(54) PHOTOELECTRIC CONVERSION DEVICE

(71) Applicant: CANON KABUSHIKI KAISHA, Tokyo (JP)

(72) Inventor: Yusuke Onuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 434 days.

(21) Appl. No.: 17/705,119

(22) Filed: Mar. 25, 2022

(65) Prior Publication Data
US 2022/0320157 A1    Oct. 6, 2022

(30) Foreign Application Priority Data
Mar. 31, 2021    (JP) .................... 2021-060266

(51) Int. Cl.
*H01L 27/14*    (2006.01)
*H01L 27/146*    (2006.01)
*H04N 25/63*    (2023.01)
*H04N 25/633*    (2023.01)

(52) U.S. Cl.
CPC .. *H01L 27/14603* (2013.01); *H01L 27/14614* (2013.01); *H04N 25/63* (2023.01); *H04N 25/633* (2023.01); *H01L 27/14643* (2013.01)

(58) Field of Classification Search
CPC ......... H01L 27/14603; H01L 27/14614; H01L 27/14643; H04N 25/63; H04N 25/633; H04N 25/65; H04N 25/67
See application file for complete search history.

(56) References Cited

U.S. PATENT DOCUMENTS

| | | | |
|---|---|---|---|
| 6,806,522 B2 | 10/2004 | Ohkubo | |
| 7,755,679 B2 | 7/2010 | Rossi | |
| 9,124,833 B2 | 9/2015 | Toyoguchi | |
| 9,252,184 B2 | 2/2016 | Amikawa | |
| 10,868,069 B2 * | 12/2020 | Toyoguchi | H04N 25/78 |
| 2002/0036303 A1 | 3/2002 | Ohkubo | |
| 2008/0218608 A1 | 9/2008 | Rossi et al. | |
| 2013/0076951 A1 | 3/2013 | Endo | |
| 2014/0027617 A1 | 1/2014 | Amikawa | |
| 2014/0078354 A1 | 3/2014 | Toyoguchi et al. | |
| 2016/0006965 A1 | 1/2016 | Lee et al. | |
| 2023/0353899 A1 * | 11/2023 | Funabashi | H01L 27/146 |

FOREIGN PATENT DOCUMENTS

| | | | |
|---|---|---|---|
| JP | 2002110955 A | 4/2002 | |
| JP | 2010520708 A | 6/2010 | |
| JP | 2014075776 A | 4/2014 | |
| JP | 2020039114 A | 3/2020 | |
| WO | 2012144181 A1 | 10/2012 | |

* cited by examiner

*Primary Examiner* — Kevin K Pyo
(74) *Attorney, Agent, or Firm* — Canon U.S.A., Inc. IP Division

(57) ABSTRACT

Provided is a photoelectric conversion device including a pixel array including a first pixel and a second pixel. The first pixel includes a photoelectric conversion unit including a first semiconductor region of a first conductivity type as a charge accumulation layer and photoelectrically converts incident light to generate a signal in accordance with the incident light, and the second pixel includes a second semiconductor region of the first conductivity type and a transistor including a first main electrode formed by a third semiconductor region connected to the second semiconductor region and a gate.

13 Claims, 15 Drawing Sheets

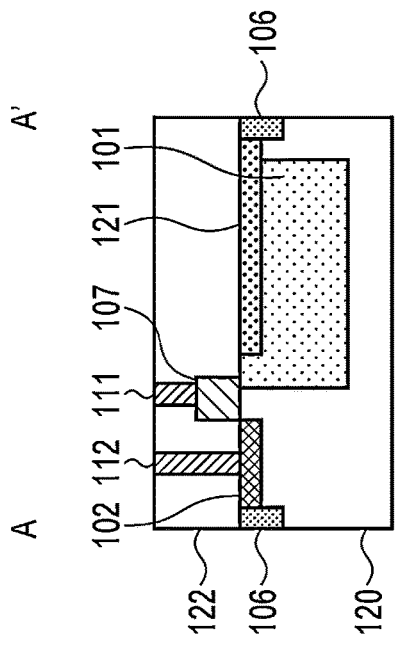
FIG. 3B
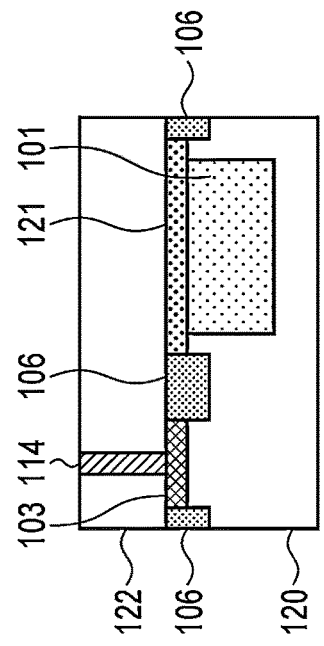
FIG. 3D
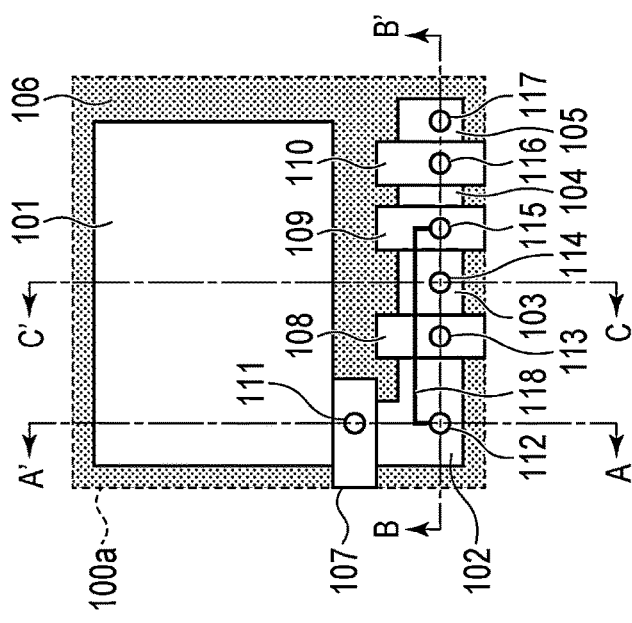
FIG. 3A
FIG. 3C

FIG. 14

| | | CAPACITANCE OF RESPECTIVE PORTIONS | | |
|---|---|---|---|---|
| | | FD | M5 | M6 |
| 1 | EFFECTIVE PIXEL 100f | 0.25 | 0.75 | |
| 2 | EFFECTIVE PIXEL 100g | | 0.50 | 0.25 |
| 3 | EFFECTIVE PIXEL 100h | | 0.25 | 0.50 |

PHOTOELECTRIC CONVERSION DEVICE

BACKGROUND

Field of the Disclosure

The present disclosure relates to a photoelectric conversion device.

Description of the Related Art

Japanese Patent Application Laid-Open No. 2002-110955 discloses a photoelectric conversion device in which a noise charge absorption region for reducing influence of noise charges is arranged inside a cell array. In such a noise charge absorption region, the potential of a semiconductor region is fixed to a constant potential.

There may be room for further improvement in performance for a pixel configuration including a structure to discharge noise charges that may cause noise from a semiconductor region as disclosed in Japanese Patent Application Laid-Open No. 2002-110955.

SUMMARY

The present disclosure intends to provide a photoelectric conversion device that can more suitably discharge noise charges.

According to one aspect of the present disclosure, there is provided a photoelectric conversion device including: a pixel array including a first pixel and a second pixel; a scanning circuit that outputs a control signal to the pixel array; and an output line connected to the first pixel and the second pixel. The first pixel includes a photoelectric conversion unit including a first semiconductor region of a first conductivity type as a charge accumulation layer and photoelectrically converts incident light to output a signal in accordance with the incident light to the output line. The second pixel includes a second semiconductor region of the first conductivity type, a transistor including a first main electrode formed by a third semiconductor region connected to the second semiconductor region, a gate connected to the scanning circuit, and a second main electrode formed by a fourth semiconductor region, a first contact connected between the fourth semiconductor region and the output line, and a second contact supplied with a power source potential and connected to the third semiconductor region.

According to one aspect of the present disclosure, there is provided a photoelectric conversion device including a pixel array including a first pixel and a second pixel. The first pixel includes a photoelectric conversion unit including a first semiconductor region of a first conductivity type as a charge accumulation layer and photoelectrically converts incident light to output a signal in accordance with the incident light. The second pixel includes a second semiconductor region of the first conductivity type, a transistor including a first main electrode formed by a third semiconductor region connected to the second semiconductor region and a gate, an insulating layer having a first hole and a second hole, a first conductive member arranged so as to pass through the first hole and connected between a power source wiring supplied with a power source potential and the third semiconductor region, and a second conductive member arranged so as to pass through the second hole and connected between the power source wiring and the gate.

Further features of various embodiments will become apparent from the following description of exemplary embodiments with reference to the attached drawings.

BRIEF DESCRIPTION OF THE DRAWINGS

FIG. 3A is a schematic plan view of the effective pixel according to the first embodiment.

FIG. 3B, FIG. 3C, and FIG. 3D are schematic sectional views of the effective pixel according to the first embodiment.

FIG. 14 is a table listing capacitances of respective portions of the effective pixel according to the sixth embodiment.

DESCRIPTION OF THE EMBODIMENTS

Example embodiments will now be described in detail in accordance with the accompanying drawings. Throughout the drawings, the same elements or corresponding elements are labeled with common references, and the description thereof may be omitted or simplified.

First Embodiment

Figure 1:
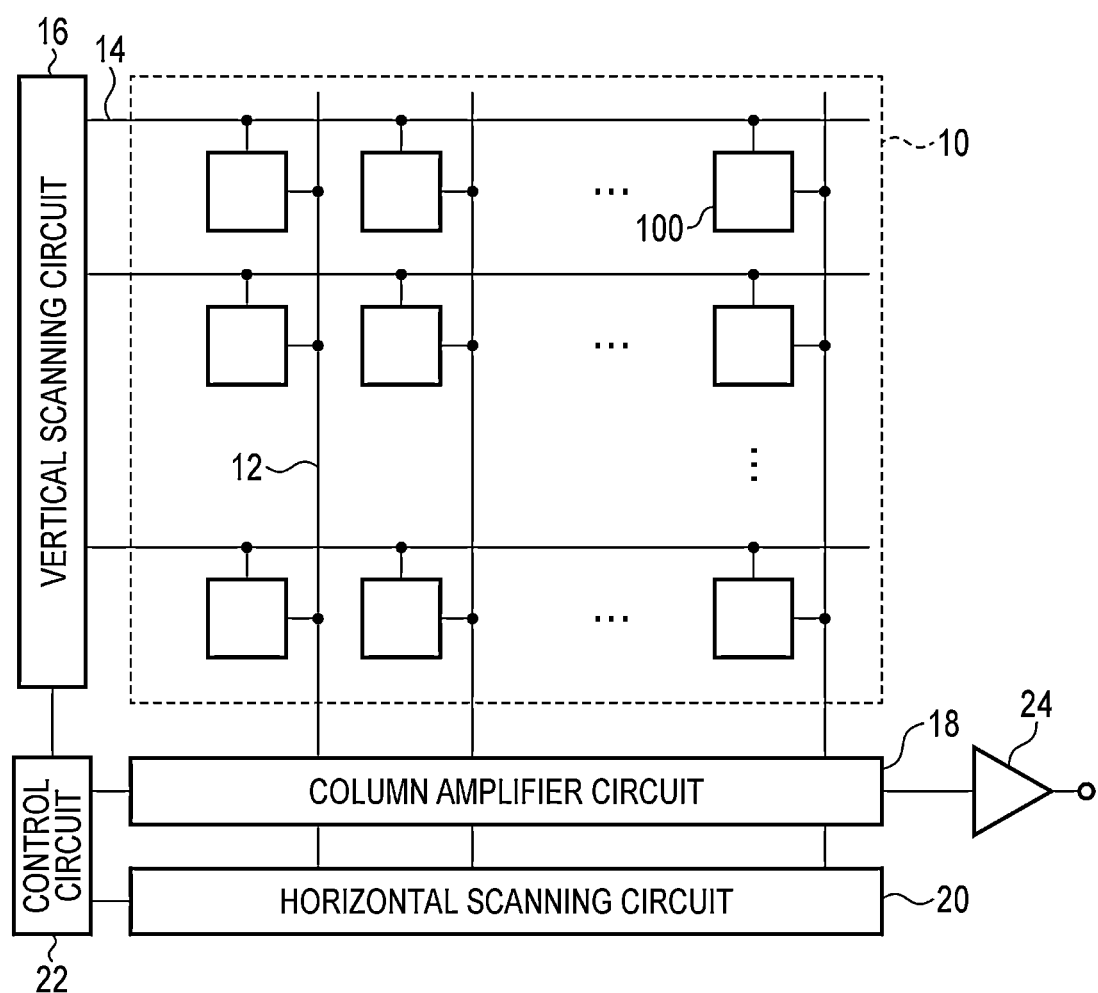
FIG. 1 is a block diagram illustrating a schematic configuration of a photoelectric conversion device according to a first embodiment.

FIG. 1 is a block diagram illustrating a general configuration of a photoelectric conversion device according to the present embodiment. The photoelectric conversion device includes a pixel array 10, a vertical scanning circuit 16, a column amplifier circuit 18, a horizontal scanning circuit 20, an output circuit 24, and a control circuit 22. These circuits may be formed on a semiconductor substrate, such as a silicon substrate. Note that, although it is assumed that the photoelectric conversion device of the present embodiment is an imaging device configured to acquire an image, the photoelectric conversion device is not limited thereto. For example, the photoelectric conversion device may be a focus-detection device, a ranging device, a time-of-flight (TOF) camera, or the like.

The pixel array 10 includes a plurality of pixels 100 arranged so as to form a plurality of rows and a plurality of columns. Note that, as described later, the pixel 100 may be any of an effective pixel, a charge discharging pixel, and an optical black (OB) pixel.

The vertical scanning circuit 16 is a scanning circuit that supplies control signals via control signal lines 14 provided on respective rows of the pixels 100, and the control signals are for controlling transistors included in the pixels 100 to be switched on (conductive state) or off (nonconductive state). The vertical scanning circuit 16 may be formed of logic circuits, such as a shift register, an address decoder, or the like. Herein, since the control signals supplied to each pixel 100 may include multiple types of control signals, the control signal lines 14 on each row may be formed of a set of a plurality of drive wirings. An output line 12 is provided on each column of the pixels 100, and signals from the pixels 100 are read to the output line 12 on a column basis.

The column amplifier circuit 18 amplifies signals output to the output lines 12. Further, the column amplifier circuit 18 may perform a correlated double sampling process using an N-signal based on a reset state of the pixel 100 and an S-signal generated by photoelectric conversion at the pixel 100. The horizontal scanning circuit 20 supplies control signals used for controlling a switch connected to an amplifier of the column amplifier circuit 18 to be switched on or off. The horizontal scanning circuit 20 may be formed of logic circuits, such as a shift register, an address decoder, or the like. The output circuit 24 is formed of a buffer amplifier, a differential amplifier, or the like, and outputs a signal from the column amplifier circuit 18 to a signal processing unit outside the photoelectric conversion device. Note that the photoelectric conversion device may be configured to further have an AD conversion unit and thereby output a digital image signal. The control circuit 22 controls operation timings or the like of the vertical scanning circuit 16, the column amplifier circuit 18, and the horizontal scanning circuit 20.

Figure 2A:
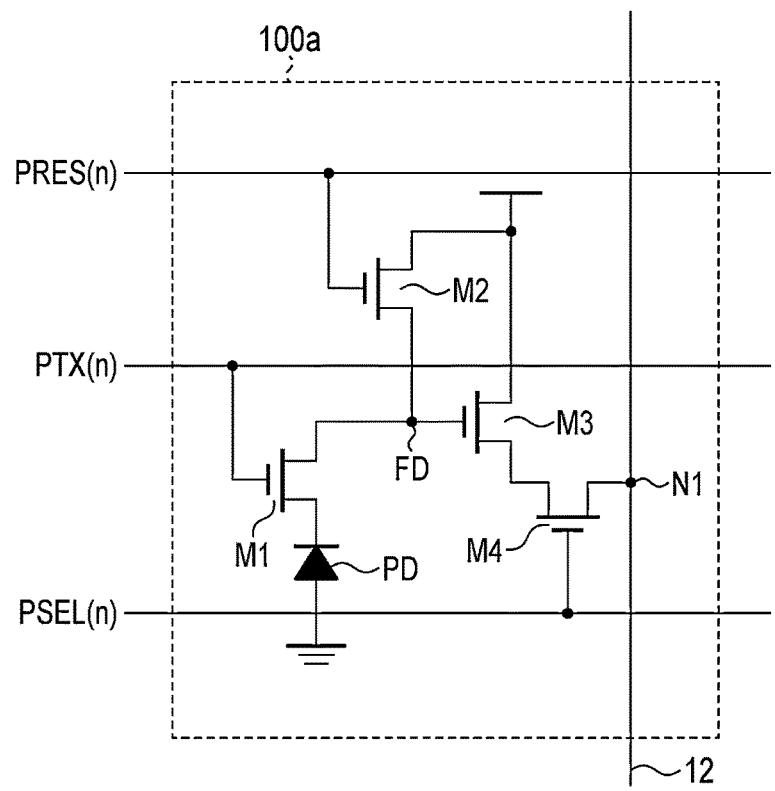
FIG. 2A is a circuit diagram of an effective pixel according to the first embodiment.
Figure 2B:
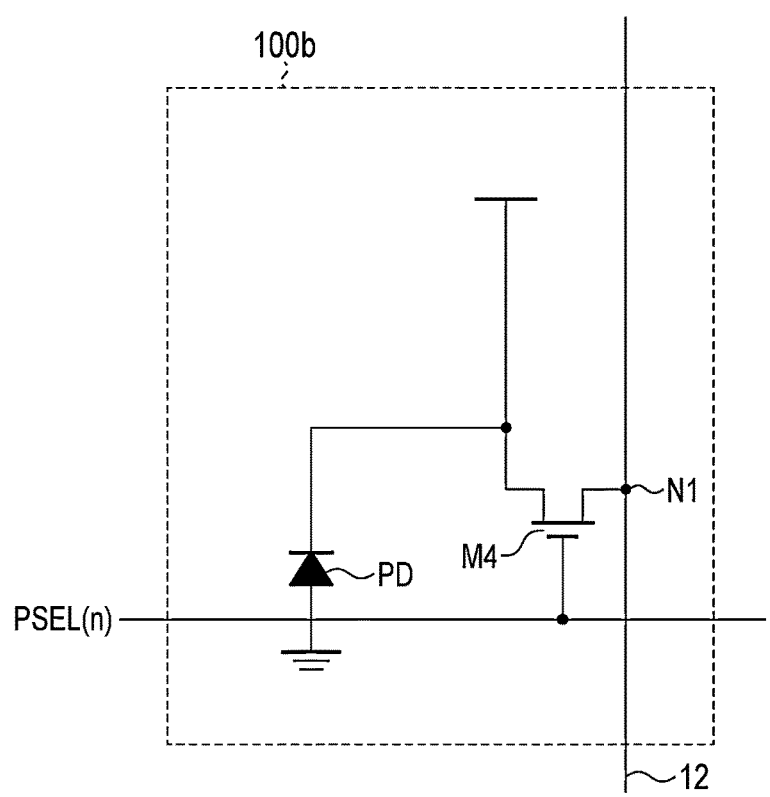
FIG. 2B is a circuit diagram of a charge discharging pixel according to the first embodiment.

FIG. 2A is a circuit diagram of an effective pixel 100a according to the present embodiment, and FIG. 2B is a circuit diagram of a charge discharging pixel 100b according to the present embodiment. The effective pixel 100a and the charge discharging pixel 100b are examples of the pixels 100 illustrated in FIG. 1. The effective pixel 100a (first pixel) is a pixel that photoelectrically converts an incident light and outputs a signal in accordance with the incident light. The charge discharging pixel 100b (second pixel) is a pixel that includes a semiconductor region supplied with a power source potential and discharges noise charges to a power source wiring. In the pixel array 10, the effective pixels 100a and the charge discharging pixels 100b are arranged. FIG. 2A and FIG. 2B illustrate a single effective pixel 100a and a single charge discharging pixel 100b arranged in the pixel array 10 as an example. Note that, in the following description, it is assumed that signal charges are electrons. However, signal charges may be holes, and in such a case, the conductivity type of each semiconductor region will be opposite.

First, the configuration of the effective pixel 100a will be described with reference to FIG. 2A. The effective pixel 100a includes a photoelectric conversion unit PD, a floating diffusion FD, a transfer transistor M1, a reset transistor M2, an amplifier transistor M3, and a selection transistor M4. These transistors are each formed of a MOS transistor having a gate as a control electrode. Control signals PTX(n), PRES(n), and PSEL(n) used for controlling the transfer transistor M1, the reset transistor M2, and the selection transistor M4 are input to the gates of these transistors from the vertical scanning circuit 16 via the control signal lines 14. Note that "n" in parenthesis represents a row number of the effective pixel 100a to which these signals are input.

The photoelectric conversion unit PD is a photoelectric conversion element that performs photoelectric conversion to generate charges in accordance with incident light and accumulates these charges. The photoelectric conversion unit PD may be formed of a photodiode formed inside a semiconductor substrate. The anode of the photodiode forming the photoelectric conversion unit PD is connected to a ground wiring supplied with a ground potential, and the cathode is connected to the source of the transfer transistor M1.

The drain of the transfer transistor M1, the source of the reset transistor M2, and the gate of the amplifier transistor M3 are connected to the floating diffusion FD. When switched on, the transfer transistor M1 transfers charges of the photoelectric conversion unit PD to the floating diffusion FD. Because of the capacity of the floating diffusion FD, the potential of the floating diffusion FD varies in accordance with charges transferred from the photoelectric conversion unit PD.

The drain of the reset transistor M2 and the drain of the amplifier transistor M3 are connected to the power source wiring having a power source potential. The source of the amplifier transistor M3 is connected to the drain of the selection transistor M4. The source of the selection transistor M4 is connected to the output line 12 at a node N1. The amplifier transistor M3 forms a source follower circuit together with a constant current source (not illustrated) connected to the output line 12. This source follower circuit outputs a signal based on the potential of the floating diffusion FD to the output line 12 via the selection transistor M4. When switched on, the reset transistor M2 resets the potential of the floating diffusion FD.

The effective pixel 100a has a micro-lens and a color filter arranged on an optical path up to where incident light is guided to the photoelectric conversion unit PD. The micro-lens converges incident light into the photoelectric conversion unit PD. The color filter selectively transmits light of a predetermined color.

Next, the configuration of the charge discharging pixel 100b will be described with reference to FIG. 2B. As illustrated in FIG. 2B, the charge discharging pixel 100b has a circuit configuration of the effective pixel 100a with the transfer transistor M1, the reset transistor M2, and the amplifier transistor M3 being eliminated. The anode of a photodiode forming the photoelectric conversion unit PD is connected to the ground wiring supplied with the ground potential, and the cathode is connected to the power source wiring having the power source potential and the drain of the selection transistor M4. The source of the selection transistor M4 is connected to the output line 12 at the node N1. Therefore, when the selection transistor M4 is switched on in accordance with the control signal PSEL(n), a potential based on the power source potential is output to the output line 12.

FIG. 3A is a schematic plan view of the effective pixel 100a according to the present embodiment. FIG. 3A illustrates a plan layout of the effective pixel 100a in plan view with respect to the semiconductor substrate on which the photoelectric conversion device is formed. FIG. 3B, FIG. 3C, and FIG. 3D are schematic sectional views of the effective pixel 100a according to the present embodiment. FIG. 3B, FIG. 3C, and FIG. 3D schematically illustrate sectional views taken along line A-A', line B-B', and line C-C' in FIG. 3A, respectively. The structure of the effective pixel 100a will be described with reference to these drawings with each other.

The effective pixel 100a has semiconductor regions 101, 102, 103, 104, 105, and 121 and an element isolation region 106 that are arranged in a semiconductor substrate 120. Further, the effective pixel 100a has gates 107, 108, 109, and 110, contacts 111, 112, 113, 114, 115, 116, and 117, a wiring 118, and an insulating layer 122 that are arranged on or above the semiconductor substrate 120. These contacts are each formed of a conductive member arranged so as to pass through a hole penetrating the insulating layer 122.

The semiconductor region 101 (first semiconductor region) is an n-type (first conductivity type) semiconductor region. The semiconductor region 121 arranged on the front face side of the semiconductor substrate 120 from the semiconductor region 101 is a p-type semiconductor region. The semiconductor region 101 and the semiconductor region 121 form a p-n junction, which forms an embedded photodiode corresponding to the photoelectric conversion unit PD in FIG. 2A. The semiconductor region 101 functions as a charge accumulation layer. Further, the semiconductor region 121 functions as a surface protection layer of the embedded photodiode. Employing such an embedded photodiode may reduce noise that may occur at an interface of the substrate surface or the like. Note that, in FIG. 3A, depiction of the semiconductor region 121 is omitted.

The gates 107, 108, 109, and 110 correspond to the gates of the transfer transistor M1, the reset transistor M2, the amplifier transistor M3, and the selection transistor M4, respectively. The contacts 111, 113, and 116 are connected to the gates 107, 108, and 110, respectively, and control signals are input thereto via these contacts. The semiconductor region 102 is an n-type semiconductor region forming the floating diffusion FD. The semiconductor region 102 further forms the drain of the transfer transistor M1 and the source of the reset transistor M2. The contact 112 is connected to the semiconductor region 102, and the contact 115 is connected to the gate 109. The contact 112 and the contact 115 are connected to each other via the wiring 118 arranged in a wiring layer layered on the insulating layer 122.

The semiconductor region 103 is an n-type semiconductor region forming the drain of the reset transistor M2 and the drain of the amplifier transistor M3. The contact 114 is connected to the semiconductor region 103, and the contact 114 is connected to the power source wiring provided in a layer on the insulating layer 122.

The semiconductor region 104 is an n-type semiconductor region forming the source of the amplifier transistor M3 and the drain of the selection transistor M4. The semiconductor region 105 is an n-type semiconductor region forming the source of the selection transistor M4. The contact 117 is connected to the semiconductor region 105 and connected to the output line 12. That is, the contact 117 corresponds to the node N1 in FIG. 2A.

Note that the semiconductor regions 102, 103, 104, and 105 each are an n-type semiconductor region having a higher impurity concentration than the semiconductor region 101. This can reduce the resistance. The element isolation region 106 may be Shallow Trench Isolation (STI), Local Oxidation of Silicon (LOCOS), or the like.

Figure 4A:
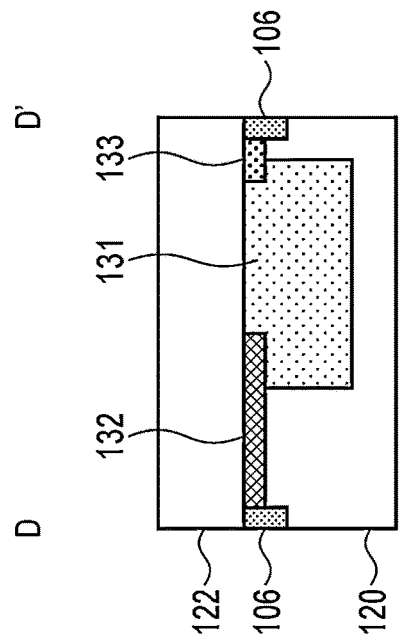
FIG. 4A is a schematic plan view of the charge discharging pixel according to the first embodiment.
Figure 4B:
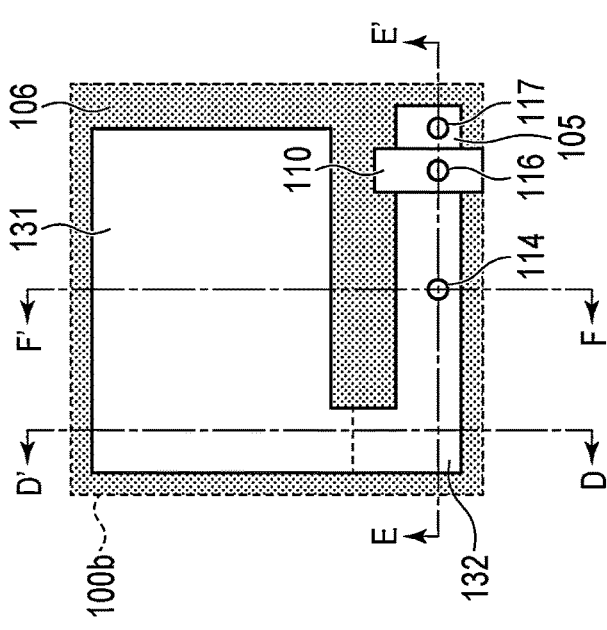
FIG. 4B, FIG. 4C, and FIG. 4D are schematic sectional views of the charge discharging pixel according to the first embodiment.
Figure 4C:
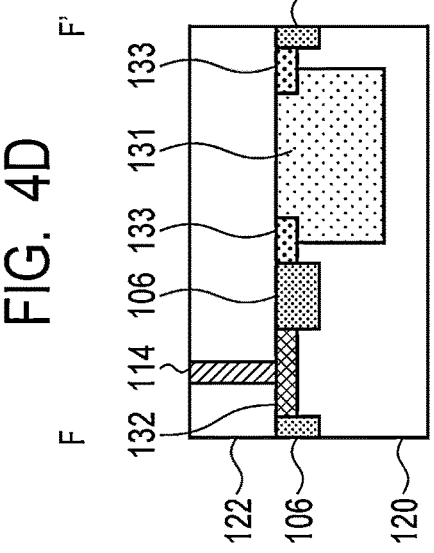
Figure 4D:
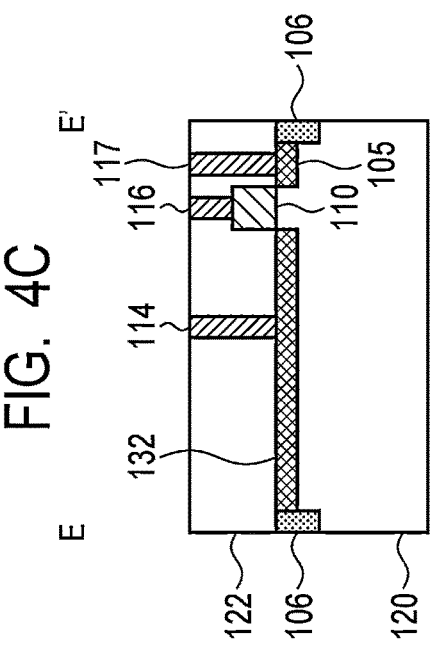

FIG. 4A is a schematic plan view of the charge discharging pixel 100b according to the present embodiment. FIG. 4A illustrates a plan layout of the charge discharging pixel 100b in plan view with respect to the semiconductor substrate on which the photoelectric conversion device is formed. FIG. 4B, FIG. 4C, and FIG. 4D are schematic sectional views of the charge discharging pixel 100b according to the present embodiment. FIG. 4B, FIG. 4C, and FIG. 4D schematically illustrate sectional views taken along line D-D', line E-E', and line F-F' in FIG. 4A, respectively. The structure of the charge discharging pixel 100b will be described with reference to these drawings with each other. Note that description for features common to the effective pixel 100a may be omitted.

The charge discharging pixel 100b has semiconductor regions 131, 132, 133, and 105 and the element isolation region 106 that are arranged in the semiconductor substrate 120. Further, the charge discharging pixel 100b has the gate 110, the contacts 114, 116, and 117, and the insulating layer 122 that are arranged on or above the semiconductor substrate 120. These contacts are each formed of a conductive member arranged so as to pass through a hole penetrating the insulating layer 122. As described with reference to FIG. 2B, no transfer transistor M1, no reset transistor M2, or no amplifier transistor M3 is arranged in the charge discharging pixel 100b, and nor is the gate corresponding thereto arranged.

The semiconductor region 131 (second semiconductor region) is an n-type semiconductor region. The semiconductor region 133 arranged on the front face side of the semiconductor substrate 120 from the semiconductor region 131 is a p-type semiconductor region. Note that, in FIG. 4A, depiction of the semiconductor region 133 is omitted. The semiconductor region 132 (third semiconductor region) is an n-type semiconductor region and is connected to the semiconductor region 131. Note that the dashed line between the semiconductor region 131 and the semiconductor region 132 illustrated in FIG. 4A represents the end of the semiconductor region 131.

The gate 110 corresponds to the gate of the selection transistor M4. The contact 116 is connected to the gate 110, and a control signal is input thereto via the contact 116. The semiconductor region 132 extends from the gate of the selection transistor M4 to the semiconductor region 131 and forms the drain (first main electrode) of the selection transistor M4. Further, the contact 114 (second contact) is connected to the semiconductor region 132 and connected to the power source wiring provided in a layer above the insulating layer 122.

The semiconductor region 105 (fourth semiconductor region) is an n-type semiconductor region forming the source (second main electrode) of the selection transistor M4. The contact 117 (first contact) is connected to the semiconductor region 105 and connected to the output line 12. That is, the contact 117 corresponds to the node N1 in FIG. 2B.

Note that the semiconductor region 132 is an n-type semiconductor region having a higher impurity concentration than the semiconductor region 131. Accordingly, the contact 114 supplied with the power source potential and the semiconductor region 132 can be connected to each other at a low resistance, and this may improve the charge discharging effect. Further, the semiconductor region 105 is also an n-type semiconductor region having a higher impurity concentration than the semiconductor region 101. This can reduce the resistance.

Unlike the effective pixel 100a, the semiconductor region 133 is arranged only near the element isolation region 106 in the charge discharging pixel 100b. This reduces the influence of junction leak that may occur when there is a p-n junction between the high-concentration n-type semiconductor region 132 and the high-concentration p-type semiconductor region 133. Note that the p-type semiconductor region 133 may not be arranged in the charge discharging pixel 100b, and in such a case, the same effect is obtained.

As described above, the photoelectric conversion device of the present embodiment has the charge discharging pixel 100b having a circuit configuration of the effective pixel 100a with the transfer transistor M1, the reset transistor M2, and the amplifier transistor M3 being eliminated. The charge discharging pixel 100b can discharge noise charges, which are present nearby, from the semiconductor region 131 to the power source wiring via the semiconductor region 132 and the contact 114. Thus, according to the present embodiment, a photoelectric conversion device that can more suitably discharge noise charges can be provided.

Note that, although the example in which the contact 114 of the charge discharging pixel 100b is arranged at the same position as that of the effective pixel 100a is illustrated in FIG. 4A, FIG. 4C, and FIG. 4D, the embodiment is not limited thereto. For example, a contact connected to the power source wiring may be directly connected to the semiconductor region 131. Further, a plurality of contacts connected to the power source wiring may be arranged.

Further, the selection transistor M4 is arranged in the charge discharging pixel 100b of the present embodiment in the same manner as the effective pixel 100a. This enables the charge discharging pixel 100b to output a signal whose level corresponds to the power source potential in response to the control signal PSEL(n). The signal whose level corresponds to the power source potential may be used for correction of a signal, for example.

It is desirable that the semiconductor region 101 of the effective pixel 100a and the semiconductor region 131 of the charge discharging pixel 100b have the same shape in plan view. Such the same shape reduces characteristic variation between pixels that would otherwise be caused when the manufacturing process is uneven due to a difference in the layout of nearby elements between a case where another effective pixel 100a is arranged near one effective pixel 100a and a case where the charge discharging pixel 100b is arranged near the one effective pixel 100a.

Second Embodiment

In the present embodiment, an example of the layout when OB pixels are arranged inside the pixel array 10 will be described. Since the configuration of a circuit block of a photoelectric conversion device, the structure of the effective pixel 100a and the charge discharging pixel 100b, and the like are the same as those of the first embodiment, the description thereof will be omitted.

Figure 5:
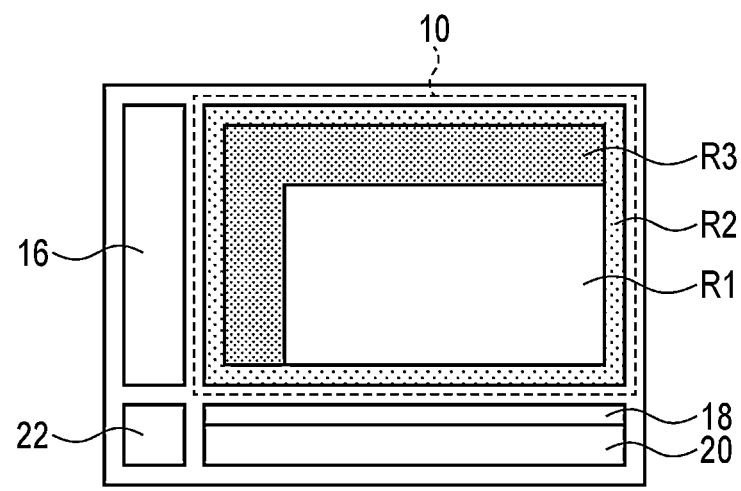
FIG. 5 is a schematic diagram illustrating a layout of a photoelectric conversion device according to a second embodiment.

FIG. 5 is a schematic diagram illustrating a layout of the photoelectric conversion device according to the present embodiment. As illustrated in FIG. 5, the pixel array 10, the vertical scanning circuit 16, the column amplifier circuit 18, the horizontal scanning circuit 20, and the control circuit 22 are arranged on a semiconductor substrate. The vertical scanning circuit 16, the column amplifier circuit 18, the horizontal scanning circuit 20, and the control circuit 22 represent an example of a peripheral circuit arranged around the pixel array 10, and the arrangement of these circuits are not limited to what is illustrated. Further, a circuit other than these circuits may be arranged around the pixel array 10.

The pixel array 10 has an effective pixel region RE a charge discharging pixel region R2, and an OB pixel region R3. The effective pixel region R1 (first pixel region) is a region in which the effective pixels 100a described in the first embodiment are arranged to form a plurality of rows and a plurality of columns.

The OB pixel region R3 (third pixel region) is a region in which OB pixels are arranged so as to form a plurality of rows and a plurality of columns. The OB pixel has the same circuit configuration as the effective pixel 100a described in the first embodiment and is a pixel in which the photoelectric conversion unit PD is covered with a light shielding film, such as a metal thin film. Accordingly, since light does not enter the photoelectric conversion unit PD of the OB pixel, the OB pixel can output a black level signal. This black level signal may be used for correction of a signal, for example. The OB pixel region R3 is arranged on the outer circumference of the effective pixel region R1. For example, the OB pixel region R3 may be arranged so as to be along two sides of the effective pixel region R1 as illustrated in FIG. 5 or may be arranged so as to be along three or four sides of the effective pixel region R1.

The charge discharging pixel region R2 (second pixel region) is a region in which the charge discharging pixels 100b described in the first embodiment are arranged so as to form a plurality of rows and a plurality of columns. The charge discharging pixel region R2 is arranged in the outer circumference of the effective pixel region R1 and the OB pixel region R3 so as to surround these regions.

In the present embodiment, the charge discharging pixel region R2 is arranged in the outer circumference of the OB pixel region R3. The charge discharging pixels 100b inside the charge discharging pixel region R2 discharge noise charges, and thereby, in particular, inflow of noise charges to the OB pixels from the outer circumferential side of the OB pixel region R3 is reduced. Accordingly, in the present embodiment, in addition to the advantageous effect described in the first embodiment, it is possible to more accurately achieve generation of a black level signal from the OB pixel.

Third Embodiment

In the present embodiment, a modified example of the circuit configuration and the structure of the charge discharging pixel 100b in the first embodiment will be described. Since the configuration of a circuit block of a photoelectric conversion device, the structure of the effective pixel 100a, and the like are the same as those of the first embodiment, the description thereof will be omitted.

Figure 6:
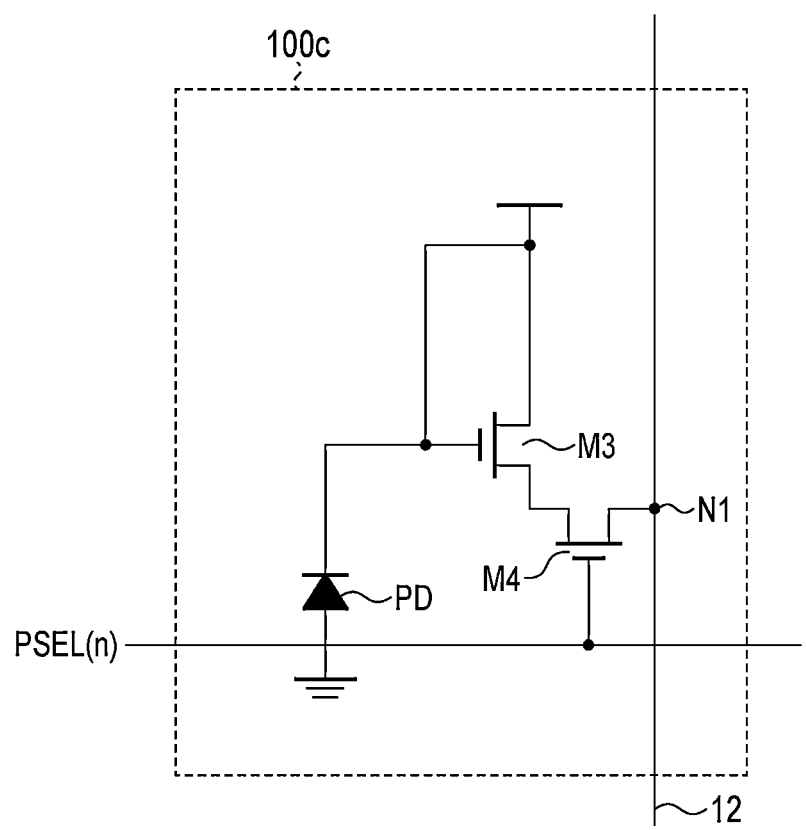
FIG. 6 is a circuit diagram of a charge discharging pixel according to a third embodiment.

FIG. 6 is a circuit diagram of a charge discharging pixel 100c according to the present embodiment. The charge discharging pixel 100c (second pixel) is the same as the charge discharging pixel 100b of the first embodiment in that both the pixels are to discharge noise charges from a semiconductor region supplied with the power source potential but differs from the charge discharging pixel 100b in the circuit configuration and the structure.

As illustrated in FIG. 6, the charge discharging pixel 100c has a circuit configuration of the effective pixel 100a with the transfer transistor M1 and the reset transistor M2 being eliminated. In other words, the charge discharging pixel 100c has a circuit configuration of the charge discharging pixel 100b with the amplifier transistor M3 being added.

The anode of the photodiode forming the photoelectric conversion unit PD is connected to the ground wiring supplied with the ground potential. The cathode of the photodiode, the gate of the amplifier transistor M3, and the drain of the amplifier transistor M3 are connected to the power source wiring having the power source potential. The source of the amplifier transistor M3 is connected to the drain of the selection transistor M4. The source of the selection transistor M4 is connected to the output line 12 at the node N1. The amplifier transistor M3 forms a source follower circuit together with a constant current source (not illustrated) connected to the output line 12. Therefore, when the selection transistor M4 is switched on in response to the control signal PSEL(n), the potential based on the power source potential is output to the output line 12.

Figure 7A:
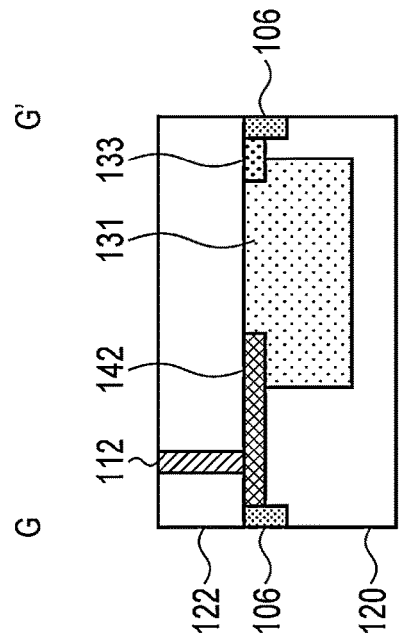
FIG. 7A is a schematic plan view of the charge discharging pixel according to the third embodiment.
Figure 7B:
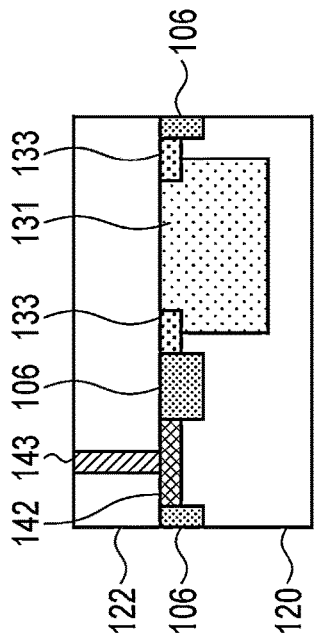
FIG. 7B, FIG. 7C, and FIG. 7D are schematic sectional views of the charge discharging pixel according to the third embodiment.
Figure 7C:
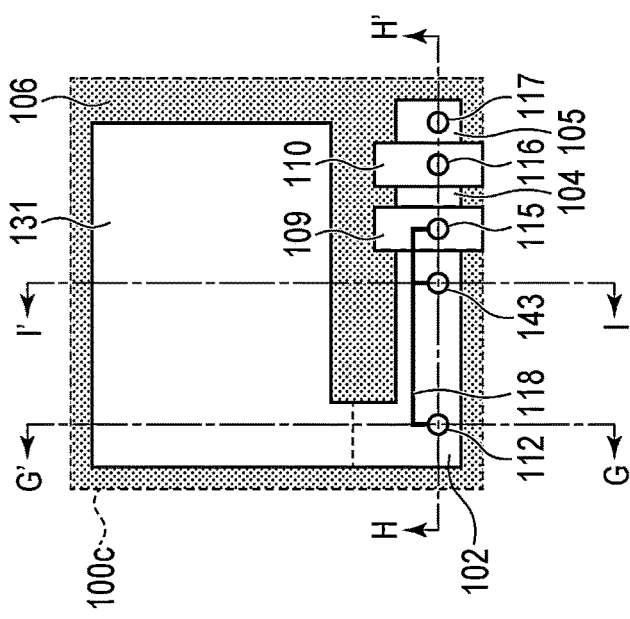
Figure 7D:
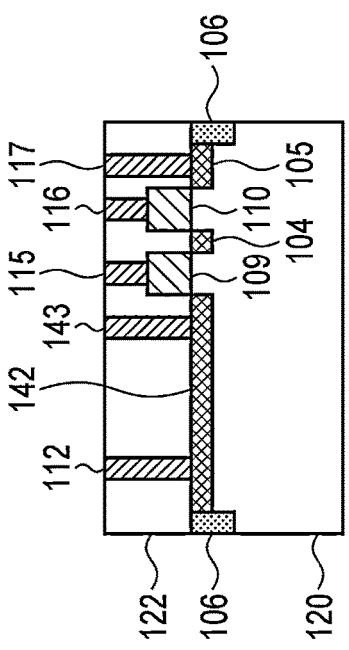

FIG. 7A is a schematic plan view of the charge discharging pixel 100c according to the present embodiment. FIG. 7A illustrates a plan layout of the charge discharging pixel 100c in plan view with respect to the semiconductor substrate on which the photoelectric conversion device is formed. FIG. 7B, FIG. 7C, and FIG. 7D are schematic sectional views of the charge discharging pixel 100c according to the present embodiment. FIG. 7B, FIG. 7C, and FIG. 7D schematically illustrate sectional views taken along line G-G', line H-H', and line I-I' in FIG. 7A, respectively. The structure of the charge discharging pixel 100c will be described with reference to these drawings with each other. Note that description for features common to the effective pixel 100a or the charge discharging pixel 100b may be omitted.

The charge discharging pixel 100c has the semiconductor regions 131, 133, 142, 104, and 105 and the element isolation region 106 that are arranged in the semiconductor substrate 120. Further, the charge discharging pixel 100c has the gates 109 and 110, the contacts 112, 143, 115, 116, and 117, and the insulating layer 122 that are arranged on or above the semiconductor substrate 120. These contacts are each formed of a conductive member arranged so as to pass through a hole penetrating the insulating layer 122. As described with reference to FIG. 6, neither the transfer transistor M1 nor the reset transistor M2 is arranged in the charge discharging pixel 100c, and nor is the gate corresponding thereto arranged.

The semiconductor region 131 (second semiconductor region) is an n-type semiconductor region. The semiconductor region 133 arranged on the front face side of the semiconductor substrate 120 from the semiconductor region 131 is a p-type semiconductor region. Note that, in FIG. 7A, depiction of the semiconductor region 133 is omitted. The semiconductor region 142 (third semiconductor region) is an n-type semiconductor region and is connected to the semiconductor region 131. Note that the dashed line between the semiconductor region 131 and the semiconductor region 142 illustrated in FIG. 7A represents the end of the semiconductor region 131.

The gates 109 and 110 correspond to the gates of the amplifier transistor M3 and the selection transistor M4, respectively. The contact 116 is connected to the gate 110, and a control signal is input via the contact 116. The semiconductor region 142 extends to the semiconductor region 131 from the gate 109 of the amplifier transistor M3 and forms the drain (first main electrode) of the amplifier transistor M3. Further, the contacts 112 and 143 (first conductive member passing through the first hole) are connected to the semiconductor region 142, the contact 115 (second conductive member passing through the second hole) is connected to the gate 109. The contact 112, the contact 143, and the contact 115 are connected to each other via a wiring 118 arranged in the wiring layer layered on the insulating layer 122. The power source potential is provided to the wiring 118 (power source wiring).

The semiconductor region 104 is an n-type semiconductor region forming the source of the amplifier transistor M3 and the drain of the selection transistor M4. The semiconductor region 105 is an n-type semiconductor region forming the source of the selection transistor M4. The contact 117 is connected to the semiconductor region 105 and connected to the output line 12. That is, the contact 117 corresponds to the node N1 in FIG. 6.

Note that the semiconductor region 142 is an n-type semiconductor region having a higher impurity concentration than the semiconductor region 132. Accordingly, the contact 112 or the contact 143 provided with the power source potential and the semiconductor region 142 can be connected to each other at a low resistance, and this may improve the charge discharging effect. Further, the semiconductor regions 104 and 105 are also n-type semiconductor regions having a higher impurity concentration than the semiconductor region 101. This can reduce the resistance.

As described above, the photoelectric conversion device of the present embodiment has the charge discharging pixel 100c having a circuit configuration of the effective pixel 100a with the transfer transistor M1 and the reset transistor M2 being eliminated. The charge discharging pixel 100c can discharge noise charges, which are present nearby, from the semiconductor region 131 to the wiring 118 via the semiconductor region 142 and the contacts 112 and 143 in the same manner as in the first embodiment. Thus, according to the present embodiment, a photoelectric conversion device that can more preferably discharge noise charges can be provided.

In the charge discharging pixel 100c of the present embodiment, the amplifier transistor M3 and the selection transistor M4 are arranged in the same manner as in the effective pixel 100a. Accordingly, in response to the control signal PSEL(n), the charge discharging pixel 100c can output substantially the same potential as the N-signal having a level based on a reset state of a pixel. This output signal may be used in correction of a signal, for example. In the present embodiment, because the N-signal output by the effective pixel 100a and a signal output by the charge discharging pixel 100c are at substantially the same level, this reduces influence of potential variation or the like between a case where the effective pixel 100a is connected to an output line 12 and a case where the charge discharging pixel 100c is connected to the same output line 12.

Note that it is desirable that the semiconductor region 101 of the effective pixel 100a and the semiconductor region 131 of the charge discharging pixel 100c have the same shape in plan view also in the present embodiment for the same reason as described in the first embodiment. Further, the charge discharging pixel 100c of the present embodiment may be arranged in the charge discharging pixel region R2 of the second embodiment, and the same advantageous effect as described in the second embodiment is obtained.

Fourth Embodiment

In the present embodiment, a modified example of a layout of the pixel array 10 in the second embodiment will be described. Since other features are the same as those of the second embodiment, the description thereof will be omitted.

Figure 8:
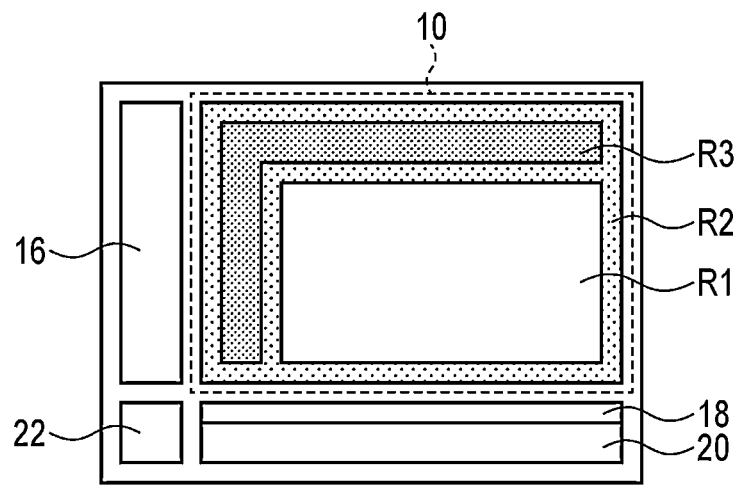
FIG. 8 is a schematic diagram illustrating a layout of a photoelectric conversion device according to a fourth embodiment.

FIG. 8 is a schematic diagram illustrating a layout of the photoelectric conversion device according to the present embodiment. In FIG. 8, a difference from the pixel array 10 illustrated in FIG. 5 of the second embodiment is the arrangement of the effective pixel region R1, the charge discharging pixel region R2, and the OB pixel region R3. As illustrated in FIG. 8, in the present embodiment, the charge discharging pixel region R2 (second pixel region) is also arranged between the effective pixel region R1 (first pixel region) and the OB pixel region R3 (third pixel region). Accordingly, in the present embodiment, in addition to the advantageous effect of the second embodiment, noise charges flowing in the OB pixel from the effective pixel region R1 are also reduced. Accordingly, in the present embodiment, it is possible to more accurately achieve generation of a black level signal from the OB pixel than in the second embodiment.

Note that, in the present embodiment, the charge discharging pixel 100b of the first embodiment may be arranged in the charge discharging pixel region R2, or the charge discharging pixel 100c of the third embodiment may be arranged in the charge discharging pixel region R2.

Fifth Embodiment

In the present embodiment, a modified example of the circuit configuration and the structure of the effective pixel 100a and the charge discharging pixels 100b and 100c in the first embodiment and the third embodiment will be described. Since the configuration of a circuit block of a photoelectric conversion device and the like are the same as those of the first embodiment, the description thereof will be omitted.

Figure 9A:
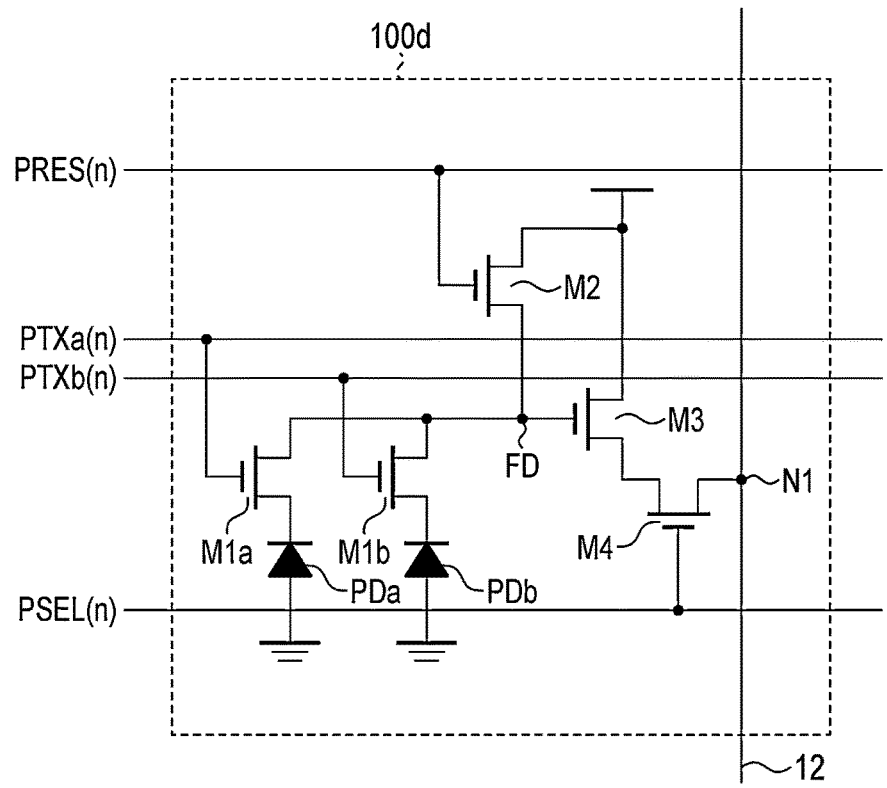
FIG. 9A is a circuit diagram of an effective pixel according to a fifth embodiment.
Figure 9B:
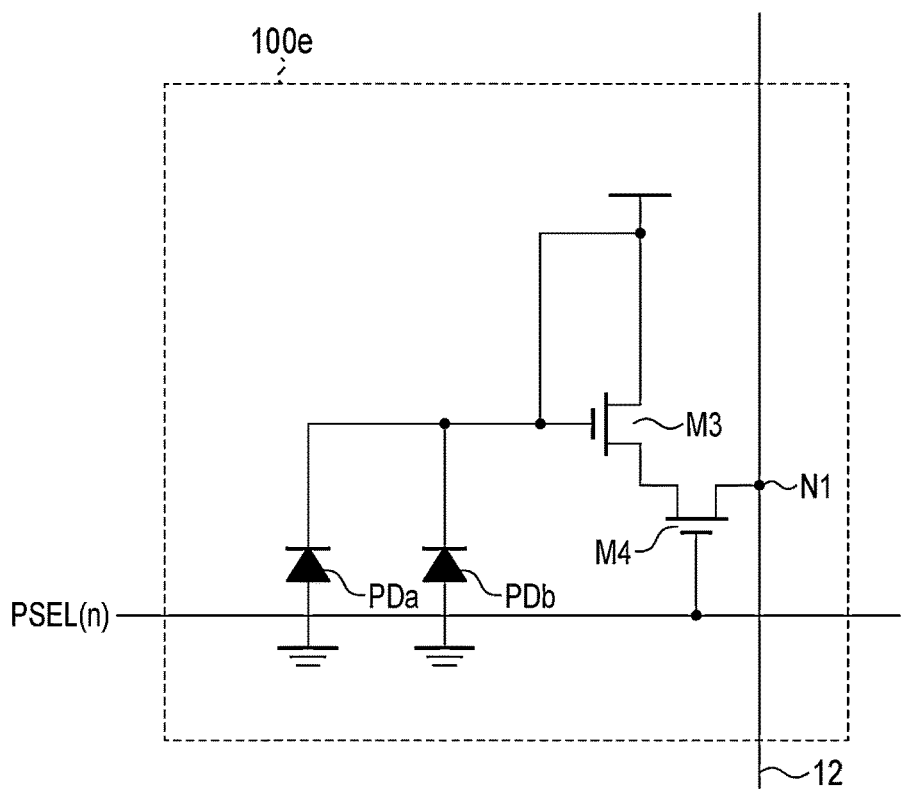
FIG. 9B is a circuit diagram of a charge discharging pixel according to the fifth embodiment.

FIG. 9A is a circuit diagram of an effective pixel 100d according to the present embodiment, and FIG. 9B is a circuit diagram of a charge discharging pixel 100e according to the present embodiment. First, in the configuration of the effective pixel 100d, features different from the effective pixel 100a of the first embodiment will be described with reference to FIG. 9A.

The effective pixel 100d (first pixel) of the present embodiment differs from the effective pixel 100a of the first embodiment in that two photoelectric conversion units PDa and PDb and two transfer transistors M1a and M1b are arranged in a single effective pixel 100d. The anodes of the photoelectric conversion units PDa and PDb are connected to the ground wiring supplied with the ground potential. The cathode of the photoelectric conversion unit PDa is connected to the source of the transfer transistor M1a, and the cathode of the photoelectric conversion unit PDb is connected to the source of the transfer transistor M1b. The control signals PTXa(n) and PTXb(n) are input to the gates of the transfer transistors M1a and M1b via the control signal lines 14 from the vertical scanning circuit 16, respectively. The drain of the transfer transistor M1a, the drain of the transfer transistor M1b, the source of the reset transistor M2, and the gate of the amplifier transistor M3 are connected to the floating diffusion FD.

The effective pixel 100d has a micro-lens and a color filter arranged on the optical path up to where incident light is guided to the photoelectric conversion unit PD. The micro-lens converges incident light into the photoelectric conversion units PDa and PDb. The color filter selectively transmits light of a predetermined color. In the present embodiment, the two PDa and PDb have a configuration to share a single micro-lens. Accordingly, since light passing through pupil regions of the same micro-lens, which are different from each other, enters the two PDa and PDb, signals generated by the photoelectric conversion units PDa and PDb, respectively, may be used as ranging signals.

Next, in the configuration of the charge discharging pixel 100e, features different from the charge discharging pixel 100c of the third embodiment will be described with reference to FIG. 9B. As illustrated in FIG. 9B, the charge discharging pixel 100e (second pixel) has a circuit configuration of the effective pixel 100d with the transfer transistors M1a and M1b and the reset transistor M2 being eliminated. The anodes of the two photodiodes forming the photoelectric conversion units PDa and PDb are connected to the ground wiring supplied with the ground potential. The cathodes of the two photodiodes, the gate of the amplifier transistor M3, and the drain of the amplifier transistor M3 are connected to the power source wiring having the power source potential.

Figure 10A:
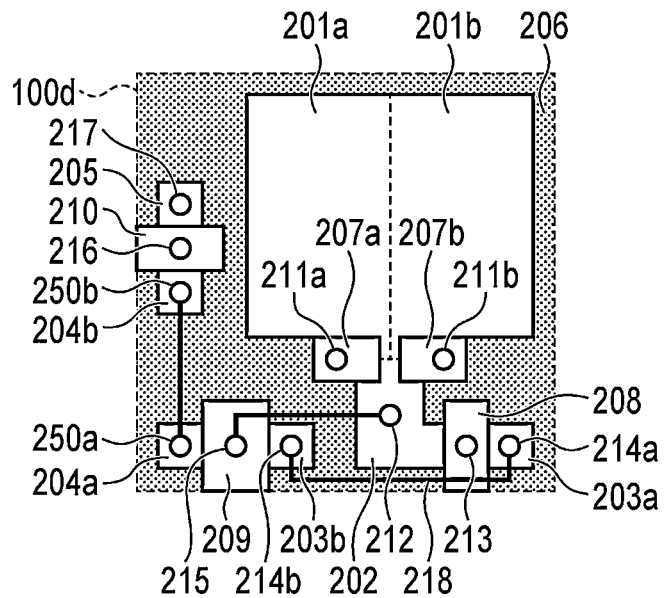
FIG. 10A is a schematic plan view of the effective pixel according to the fifth embodiment.
Figure 10B:
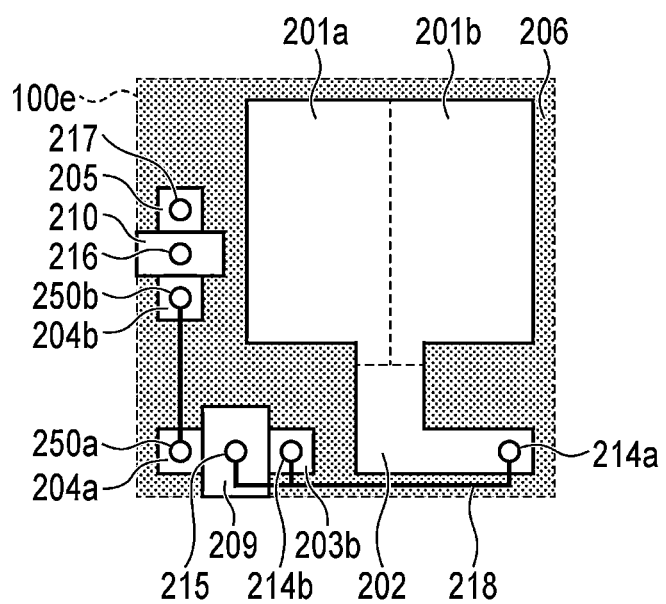
FIG. 10B is a schematic plan view of the charge discharging pixel according to the fifth embodiment.

FIG. 10A is a schematic plan view of the effective pixel 100d according to the present embodiment and illustrates a plan layout of the effective pixel 100d in plan view with respect to the semiconductor substrate on which the photoelectric conversion device is formed. FIG. 10B is a schematic plan view of the charge discharging pixel 100e according to the present embodiment and illustrates a plan layout of the charge discharging pixel 100e in plan view with respect to the semiconductor substrate on which the photoelectric conversion device is formed. First, the structure of the effective pixel 100d will be described with reference to FIG. 10A. Note that description of features common to the effective pixel 100a may be omitted.

The effective pixel 100d has semiconductor regions 201a, 201b, 202, 203a, 203b, 204a, 204b, and 205 and an element isolation region 206 that are arranged in the semiconductor substrate. Further, the effective pixel 100d has gates 207a, 207b, 208, 209, and 210, contacts 211a, 211b, 212, 213, 214a, 214b, 215, 216, 217, 250a, and 250b, and a wiring 218 that are arranged on or above the semiconductor substrate. These contacts are each formed of a conductive member arranged so as to pass through a hole penetrating the insulating layer.

The semiconductor regions 201a and 201b (first semiconductor region) are n-type semiconductor regions. In the same manner as in the first embodiment, a p-type semiconductor region (not illustrated) may be arranged on the front face side of the semiconductor substrate from the semiconductor regions 201a and 201b, and the photodiode of the present embodiment may also be an embedded photodiode.

The gates 207a, 207b, 208, 209, and 210 correspond to the gates of the transfer transistor M1a, the transfer transistor M1b, the reset transistor M2, the amplifier transistor M3, and the selection transistor M4, respectively. The contacts 211a, 211b, 213, and 216 are connected to the gates 207a, 207b, 208, and 210, respectively, and control signals are input via these contacts. The semiconductor region 202 is an n-type semiconductor region forming the floating diffusion FD. Further, the semiconductor region 202 further forms the drains of the transfer transistor M1a and M1b and the source of the reset transistor M2. The contact 212 is connected to the semiconductor region 202, and the contact 215 is connected to the gate 209. The contact 212 and the contact 215 are connected to each other via a wiring arranged in the wiring layer layered on the insulating layer.

The semiconductor region 203a is an n-type semiconductor region forming the drain of the reset transistor M2, and the semiconductor region 203b is an n-type semiconductor region forming the drain of the amplifier transistor M3. The contact 214a is connected to the semiconductor region 203a, and the contact 214b is connected to the semiconductor region 203b. The contact 214a and the contact 214b are connected to the wiring 218 that is the power source wiring provided in a layer on the insulating layer.

The semiconductor region 204a is an n-type semiconductor region forming the source of the amplifier transistor M3, and the semiconductor region 204b is an n-type semiconductor region forming the drain of the selection transistor M4. The contact 250a is connected to the semiconductor region 204a, and the contact 250b is connected to the semiconductor region 204b. The contact 250a and the contact 250b are connected to each other by a wiring provided in a layer on the insulating layer.

The semiconductor region 205 is an n-type semiconductor region forming the source of the selection transistor M4. The contact 217 is connected to the semiconductor region 205, and the contact 217 is connected to the output line 12. That is, the contact 217 corresponds to the node N1 in FIG. 9A.

Note that the semiconductor regions 202, 203a, 203b, 204a, 204b, and 205 are n-type semiconductor regions having a higher impurity concentration than the semiconductor regions 201a and 201b. This can reduce the resistance. The element isolation region 106 may be STI, LOCOS, or the like.

Next, the structure of the charge discharging pixel 100e will be described with reference to FIG. 10B. Note that description of features common to the charge discharging pixel 100c or the effective pixel 100d may be omitted.

The charge discharging pixel 100e has the semiconductor regions 201a, 201b, 202, 203b, 204a, 204b, and 205 and the element isolation region 206 arranged in a semiconductor substrate. Further, the charge discharging pixel 100e has the gates 209 and 210 and the contacts 214a, 214b, 215, 216, 217, 250a, and 250b arranged on or above the semiconductor substrate. These contacts are each formed of a conductive member arranged so as to pass through a hole penetrating the insulating layer. As illustrated with reference to FIG. 9B, no transfer transistor M1a or M1b or no reset transistor M2 is arranged in the charge discharging pixel 100e, and nor is the gate corresponding thereto arranged.

The semiconductor regions 201a and 201b (second semiconductor region) are n-type semiconductor regions. The semiconductor region 202 is an n-type semiconductor region and is connected to the semiconductor regions 201a and 201b. The contact 214a is connected to the semiconductor region 202. The contact 215 (the second conductive member passing through the second hole) is connected to the gate 209 corresponding to the gate of the amplifier transistor M3. The semiconductor region 203b (third semiconductor region) is an n-type semiconductor region forming the drain (first main electrode) of the amplifier transistor M3. The contact 214b (the first conductive member passing through the first hole) is connected to the semiconductor region 203b. The contact 214a, the contact 214b, and the contact 215 are connected to each other via the wiring 218 arranged in the wiring layer layered on the insulating layer. The power source potential is provided to the wiring 218 (power source wiring). Since the features other than the above are the same as those of the effective pixel 100d, the description thereof will be omitted.

Note that the semiconductor region 202 is an n-type semiconductor region having a higher impurity concentration than the semiconductor regions 201a and 201b. Accordingly, the contact 214a provided with the power source potential and the semiconductor regions 201a and 201b can be connected to each other at a low resistance, and this may improve the charge discharging effect. Further, the semiconductor regions 203b, 204a, 204b, and 205 are also n-type semiconductor regions having a higher impurity concentration than the semiconductor region 201a and 201b. This can reduce the resistance.

As described above, the photoelectric conversion device of the present embodiment has the charge discharging pixel 100e having a circuit configuration of the effective pixel 100d with the transfer transistors M1a and M1b and the reset transistor M2 being eliminated. The charge discharging pixel 100e can discharge noise charges present nearby to the wiring 118 in the same manner as in the first embodiment or the third embodiment. Thus, according to the present embodiment, a photoelectric conversion device that can more preferably discharge noise charges can be provided.

In the charge discharging pixel 100e of the present embodiment, the amplifier transistor M3 and the selection transistor M4 are arranged in the same manner as in the effective pixel 100d. Accordingly, influence of potential variation or the like between a case where the effective pixel 100d is connected to an output line 12 and a case where the charge discharging pixel 100e is connected to the same output line 12 is reduced for the same reason as described in the third embodiment.

Note that it is desirable that the semiconductor region 201a of the effective pixel 100d and the semiconductor region 201a of the charge discharging pixel 100e have the same shape in plan view also in the present embodiment for the same reason as described in the first embodiment. Further, it is also desirable that the semiconductor region 201b of the effective pixel 100d and the semiconductor region 201b of the charge discharging pixel 100e have the same shape in plan view. The charge discharging pixel 100e of the present embodiment may be arranged in the charge discharging pixel region R2 of the second embodiment or the fourth embodiment, and the same advantageous effect as described in the second embodiment or the fourth embodiment is obtained.

Sixth Embodiment

In the present embodiment, three types of modified examples of the circuit configuration and the structure of the effective pixel 100a in the first embodiment will be described. Since the configuration of the circuit block of the photoelectric conversion device, the structure of the charge discharging pixel 100b, and the like are the same as those of the first embodiment, the description thereof will be omitted.

Figure 11:
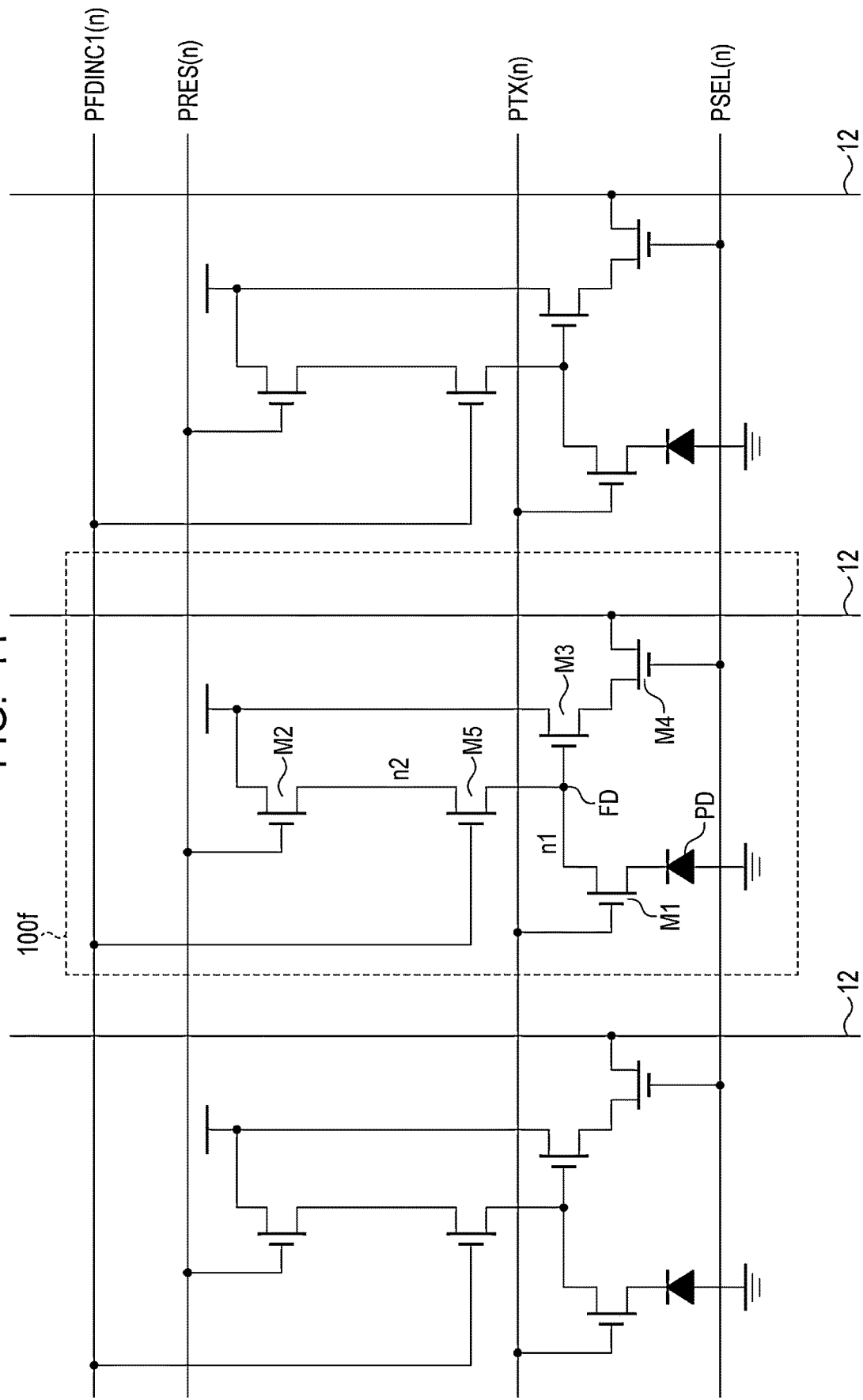
FIG. 11 is a circuit diagram of an effective pixel according to a sixth embodiment.

FIG. 11 is a circuit diagram of the effective pixel 100f according to the present embodiment. In the configuration of the effective pixel 100f, features different from the effective pixel 100a of the first embodiment will be described with reference to FIG. 11.

The effective pixel 100f of the present embodiment differs from the effective pixel 100a of the first embodiment in that a first capacitance addition transistor M5 (first transistor) is further arranged. The source of the first capacitance addition transistor M5 is connected to the floating diffusion FD. The drain of the first capacitance addition transistor M5 is connected to the source of the reset transistor M2. A control signal PFDINC1(n) is input to the gate of the first capacitance addition transistor M5 from the vertical scanning circuit 16 via the control signal line 14. Note that the reference "n1" in FIG. 11 represents the first node corresponding to the node of the floating diffusion FD. The reference "n2" represents the second node corresponding to a connecting point of the drain of the first capacitance addition transistor M5 and the source of the reset transistor M2.

The first capacitance addition transistor M5 has a function of adding a capacitance to the capacitance of the floating diffusion FD. When the control signal PFDINC1(n) is at a high level, the first capacitance addition transistor M5 is switched on. When the first capacitance addition transistor M5 is switched on, a channel is formed in the first capacitance addition transistor M5, and the capacitance (MOS capacitance) due to this channel is added to the capacitance of the floating diffusion FD. Further, the capacitance parasitic on another electrode (drain) of the first capacitance addition transistor M5 is also added to the capacitance of the floating diffusion FD. An example of such a parasitic capacitance may be a capacitance between the gate electrode and another electrode (drain), a p-n junction capacitance of a semiconductor region forming another electrode, a capacitance with respect to a surrounding wiring, or the like. In such a way, the capacitance of the first capacitance addition transistor M5 is added to the floating diffusion FD resulting in an increased overall capacitance, thereby charges that can be held are increased, and the dynamic range is expanded. Further, when the control signal PFDINC1(n) is at a low level and the first capacitance addition transistor M5 is thus in an off-state, the capacitance of the first capacitance addition transistor M5 is not added to the floating diffusion FD. In such a case, the sensitivity of the effective pixel 100f (for example, an amount of voltage change per a single charge (charge-voltage conversion efficiency)) can be increased. In such a way, the effective pixel 100f of the present embodiment can change the sensitivity by control of the first capacitance addition transistor M5.

Note that the first capacitance addition transistor M5 may be arranged in parallel to the reset transistor M2. In such a case, since the capacitance parasitic on the floating diffusion FD increases when the first capacitance addition transistor M5 is in the off-state, the charge-voltage conversion efficiency when no capacitance is added decreases. It is therefore desirable that the first capacitance addition transistor M5 and the reset transistor M2 be connected in series to the floating diffusion FD.

Figure 12:
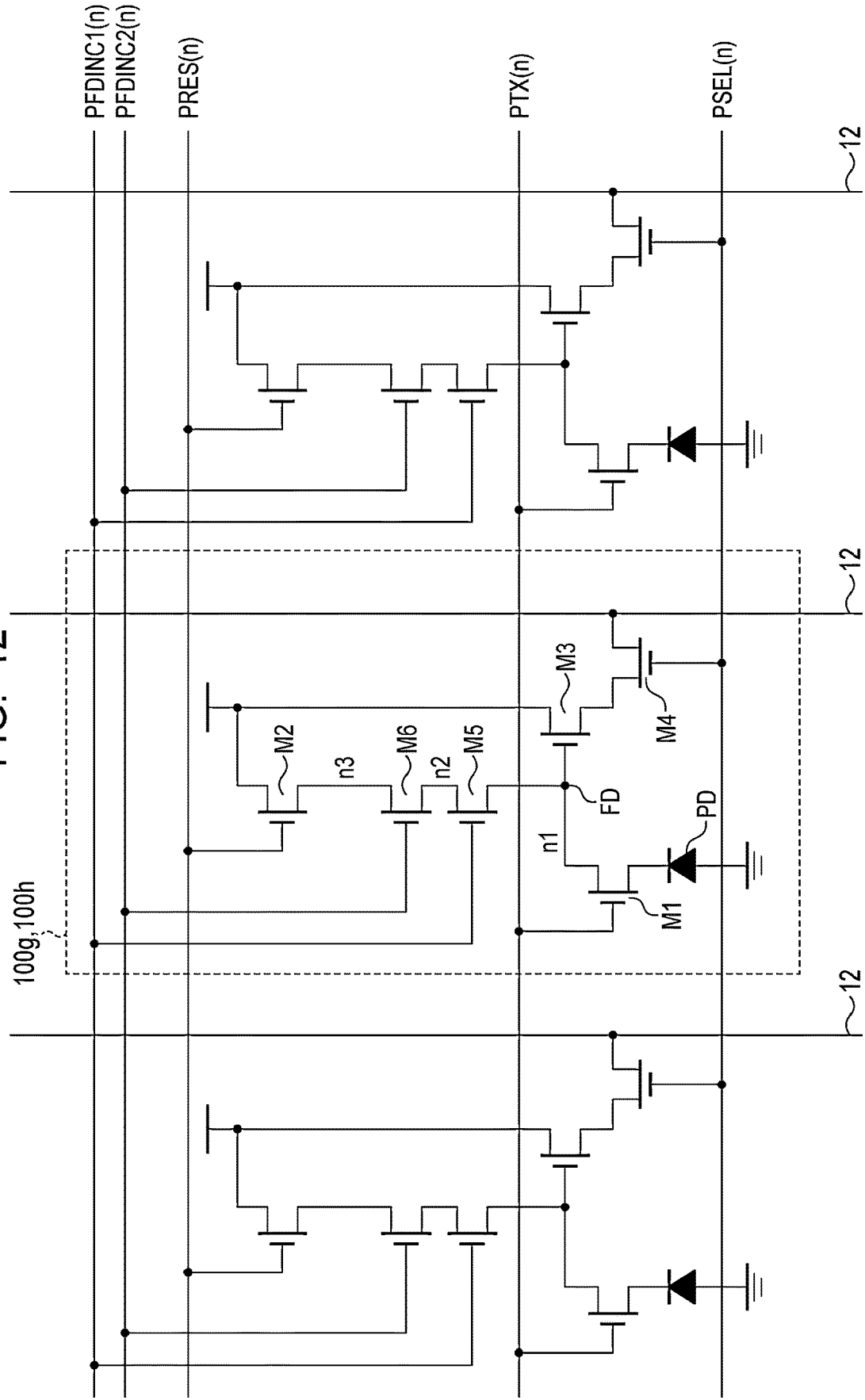
FIG. 12 is a circuit diagram of the effective pixel according to the sixth embodiment.

Next, another modified example of the circuit configuration and the structure of the effective pixel 100a in the first embodiment will be described. FIG. 12 is a circuit diagram of the effective pixels 100g and 100h according to the present embodiment. In the configuration of the effective pixels 100g and 100h, features different from the effective pixel 100a of the first embodiment will be described with reference to FIG. 12.

The effective pixels 100g and 100h of the present embodiment differ from the effective pixel 100a of the first embodiment in that the first capacitance addition transistor M5 and a second capacitance addition transistor M6 (second transistor) are further arranged. The source of the first capacitance addition transistor M5 is connected to the floating diffusion FD. The drain of the first capacitance addition transistor M5 is connected to the source of the second capacitance addition transistor M6. The drain of the second capacitance addition transistor M6 is connected to the source of the reset transistor M2. The control signal PFDINC1(n) is input to the gate of the first capacitance addition transistor M5 from the vertical scanning circuit 16 via the control signal line 14. A control signal PFDINC2(n) is input to the gate of the second capacitance addition transistor M6 from the vertical scanning circuit 16 via the control signal line 14. Note that the reference "n1" in FIG. 11 represents the first node corresponding to the node of the floating diffusion FD. The reference "n2" represents the second node corresponding to the connecting point of the drain of the first capacitance addition transistor M5 and the source of the second capacitance addition transistor M6. The reference "n3" represents the third node corresponding to the connecting point of the drain of the second capacitance addition transistor M6 and the source of the reset transistor M2.

When the control signal PFDINC1(n) is at the high level and the control signal PFDINC2(n) is at the low level, the first capacitance addition transistor M5 is in an on-state, and the second capacitance addition transistor M6 is in an off-state. Accordingly, the capacitance of the first capacitance addition transistor M5 is added to the floating diffusion FD. When the control signal PFDINC1(n) and the control signal PFDINC2(n) are at the high level, the first capacitance addition transistor M5 and the second capacitance addition transistor M6 are in the on-state. Accordingly, the capacitances of the first capacitance addition transistor M5 and the second capacitance addition transistor M6 are added to the floating diffusion FD. When the control signal PFDINC1(n) and the control signal PFDINC2(n) are at the high low level, the first capacitance addition transistor M5 and the second capacitance addition transistor M6 are in the off-state. At this time, neither the capacitance of the first capacitance addition transistor M5 nor the second capacitance addition transistor M6 is added to the floating diffusion FD. In such a way, the effective pixel 100g of the present modified example can change the sensitivity in three levels by controlling the first capacitance addition transistor M5 and the second capacitance addition transistor M6 to change the capacitance in three levels.

Note that, since the difference between the effective pixel 100g and the effective pixel 100h is in a level relationship of the capacitances of the first capacitance addition transistor M5 and the second capacitance addition transistor M6, the circuit diagrams of the effective pixel 100g and the effective pixel 100h are common to each other as illustrated in FIG. 12.

Figure 13A:
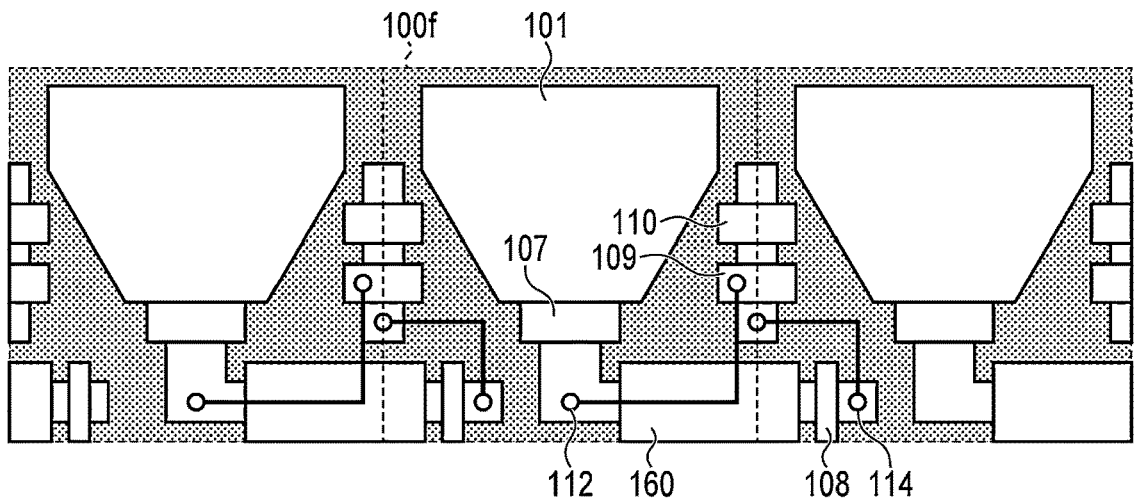
FIG. 13A, FIG. 13B, and FIG. 13C are schematic plan views of the effective pixel according to the sixth embodiment.
Figure 13B:
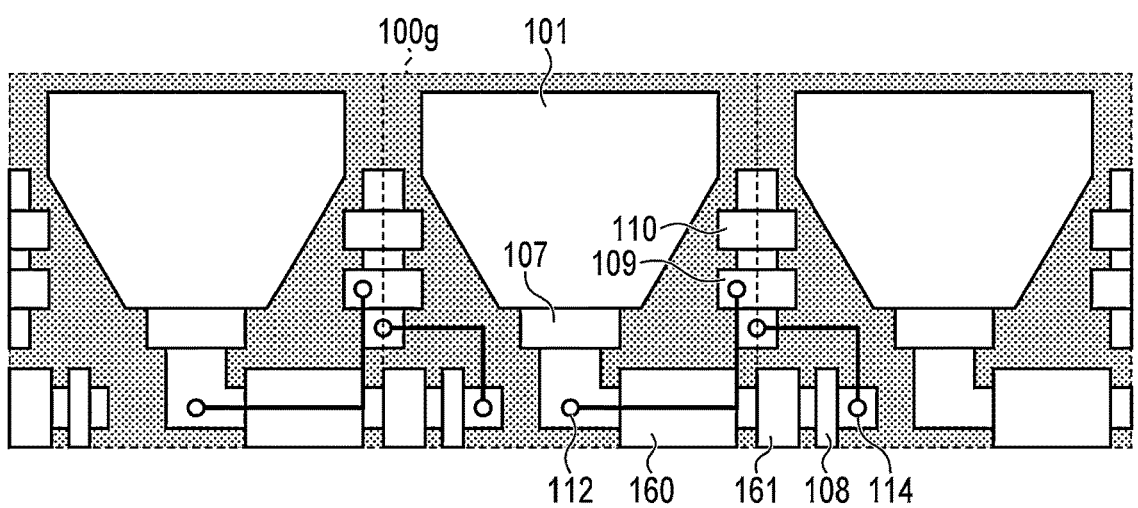
Figure 13C:
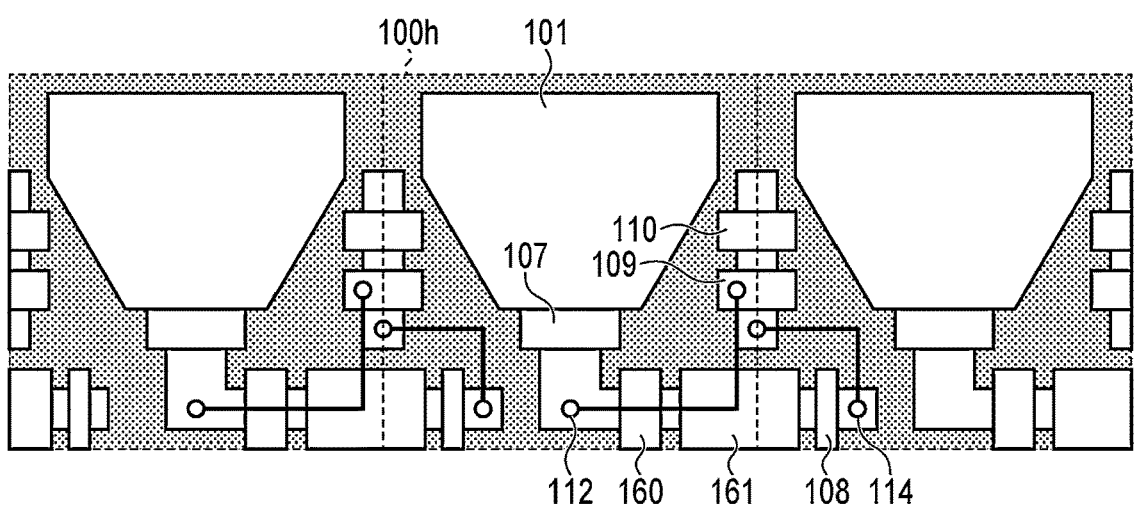

FIG. 13A is a schematic plan view of the effective pixel 100f according to the present embodiment. FIG. 13B is a schematic plan view of the effective pixel 100g according to the present embodiment. FIG. 13C is a schematic plan view of the effective pixel 100h according to the present embodiment. The configuration of the first capacitance addition transistor M5 and the second capacitance addition transistor M6 will be mainly described with reference to these schematic plan views. Since elements other than the first capacitance addition transistor M5 and the second capacitance addition transistor M6 are generally the same as those described in the first embodiment, the description thereof will be omitted or simplified.

The effective pixel 100g has the semiconductor region 101 arranged in the semiconductor substrate 120. Further, the effective pixel 100g has the gates 107, 108, 109, 110, and 160 and the contacts 112 and 114 arranged on or above the semiconductor substrate 120. Further, the effective pixel 100g and the effective pixel 100h have a gate 161 in addition to the configuration of the effective pixel 100g. The gates 107, 108, 109, and 110 correspond to the gates of the transfer transistor M1, the reset transistor M2, the amplifier transistor M3, and the selection transistor M4, respectively. Further, the gates 160 and 161 correspond to the gates of the first capacitance addition transistor M5 and the second capacitance addition transistor M6, respectively. The contact 112 is connected to the semiconductor region forming the floating diffusion FD. The contact 114 is connected to the power source wiring.

The difference between the effective pixel 100g and the effective pixel 100h is in a level relationship of the capacitances of the first capacitance addition transistor M5 and the second capacitance addition transistor M6. In the effective pixel 100g, the capacitance of the first capacitance addition transistor M5 is larger than the capacitance of the second capacitance addition transistor M6. In contrast, in the effective pixel 100h, the capacitance of the second capacitance addition transistor M6 is larger than the capacitance of the first capacitance addition transistor M5. Herein, the capacitances of the first capacitance addition transistor M5 and the second capacitance addition transistor M6 may be proportional to their gate lengths. As illustrated in FIG. 13B, in the effective pixel 100g, the gate length of the first capacitance addition transistor M5 (gate 160) is larger than the gate length of the second capacitance addition transistor M6 (gate 161). In contrast, as illustrated in FIG. 13C, in the effective pixel 100h, the gate length of the second capacitance addition transistor M6 (gate 161) is larger than the gate length of the first capacitance addition transistor M5 (gate 160). In FIG. 13B and FIG. 13C, the gate widths of the first capacitance addition transistor M5 and the second capacitance addition transistor M6 are the same but may be different from each other.

FIG. 14 is a table listing capacitances of respective portions of the effective pixels 100f, 100g, and 100h according to the sixth embodiment. FIG. 14 lists capacitances of the floating diffusion FD, the first capacitance addition transistor M5, and the second capacitance addition transistor M6 in the effective pixels 100f, 100g, and 100h. Note that the value of capacitances listed in FIG. 14 is represented in arbitrary unit and normalized so that the total value resulted when all the capacitances of respective portions are summed is 1. In the example of FIG. 14, in the effective pixel 100f, the capacitance of the floating diffusion FD is 0.25, and the capacitance of the first capacitance addition transistor M5 is 0.75. In the effective pixel 100g, the capacitance of the floating diffusion FD is 0.25, the capacitance of the first capacitance addition transistor M5 is 0.50, and the capacitance of the second capacitance addition transistor M6 is 0.25. In the effective pixel 100h, the capacitance of the floating diffusion FD is 0.25, the capacitance of the first capacitance addition transistor M5 is 0.25, and the capacitance of the second capacitance addition transistor M6 is 0.50. In such a way, FIG. 14 illustrates the example of the effective pixel 100g in which the capacitance of the first capacitance addition transistor M5 is larger than the capacitance of the second capacitance addition transistor M6 and the example of the effective pixel 100h in which the capacitance of the second capacitance addition transistor M6 is larger than the capacitance of the first capacitance addition transistor M5.

In the effective pixel 100g, the total capacitance may vary in three ways, 0.25, 0.75, and 1 in accordance with the control signals PFDINC1(n) and PFDINC2(n). Further, in the effective pixel 100h, the total capacitance may vary in three ways, 0.25, 0.50, and 1 in accordance with the control signals PFDINC1(n) and PFDINC2(n). For example, it is assumed that such switching of the capacitance is used for application in which the gain of the photoelectric conversion device (the gain outside the pixels, such as the column amplifier circuit 18) is set in three ways, fourfold, twofold, and onefold, and these three ways of capacitances are used to change the sensitivity of the pixel, respectively. In such application, it is possible to output a signal at an appropriate level while avoiding signal saturation. Herein, noise included in the output signal is proportional to both the gain and the capacitance, that is, proportional to the product of the gain and the capacitance. When the configuration as with the effective pixel 100h in which the capacitance of the second capacitance addition transistor M6 is larger than the capacitance of the first capacitance addition transistor M5 is used, the relationship between the gain and the total capacitance is closer to inverse proportional. Accordingly, since it is possible to make the product of the gain and the total capacitance closer to constant, this can achieve even noise in various gains to improve the S/N ratio. However, this is an example, and the suitable level relationship and ratio between the first capacitance addition transistor M5 and the second capacitance addition transistor M6 may vary in accordance with design.

According to the present embodiment, a photoelectric conversion device that can change charge-voltage conversion efficiency can be provided. Further, according to the modified example of the effective pixels 100g and 100h, a photoelectric conversion device that can change the charge-voltage conversion efficiency in three levels can be provided.

Seventh Embodiment

Figure 15:
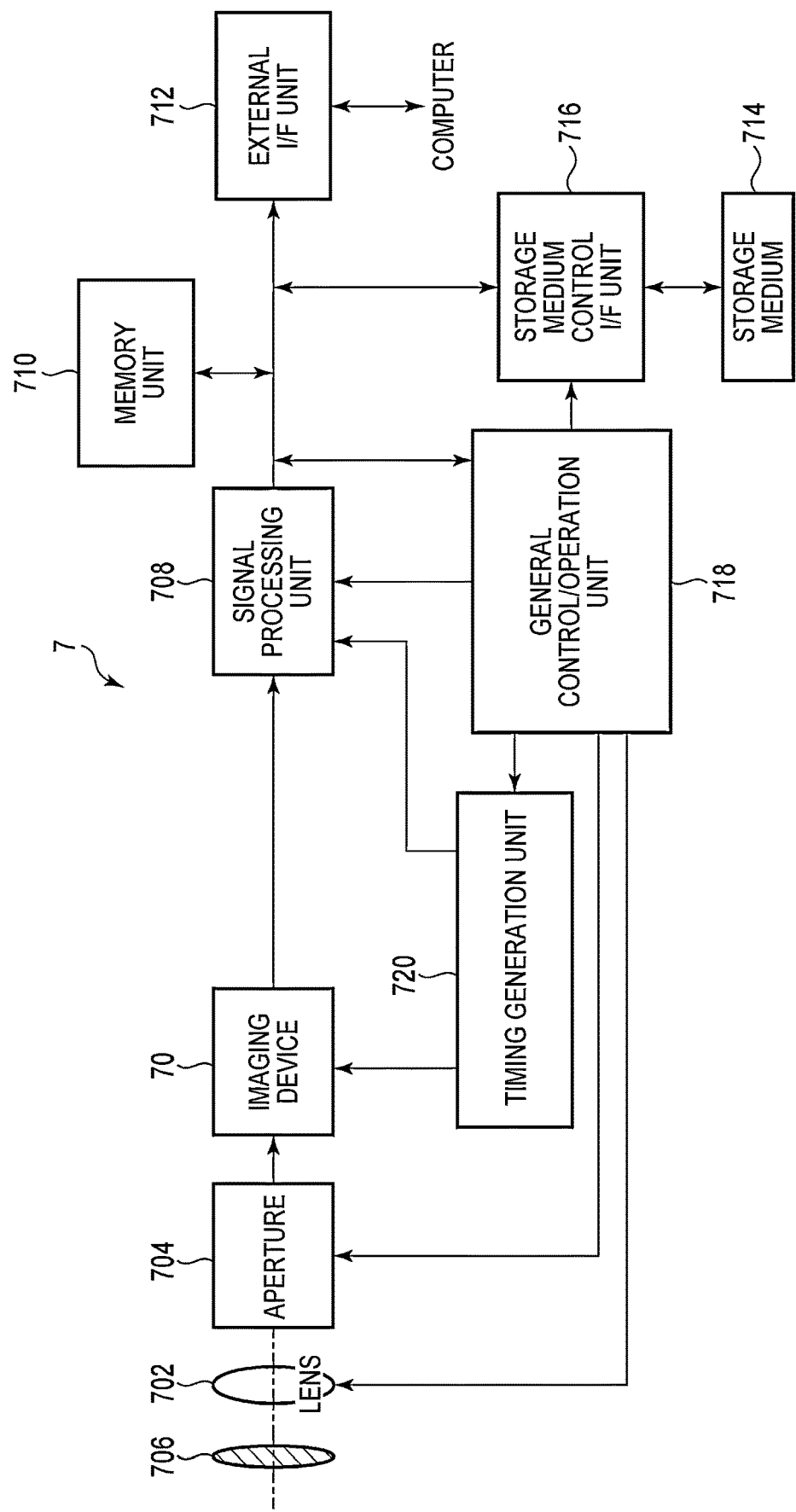
FIG. 15 is a block diagram of an apparatus according to the sixth embodiment.

Each photoelectric conversion device in the embodiments described above is applicable to various apparatuses. Such an apparatus may be a digital still camera, a digital camcorder, a camera head, a copy machine, a fax machine, a mobile phone, an on-vehicle camera, an observation satellite, a surveillance camera, or the like. FIG. 15 illustrates a block diagram of a digital still camera as an example of an apparatus.

An apparatus 7 illustrated in FIG. 15 includes a barrier 706, a lens 702, an aperture 704, and an imaging device 70 (an example of the photoelectric conversion device). The apparatus 7 further includes a signal processing unit (processing device) 708, a timing generation unit 720, a general control/operation unit 718 (control device), a memory unit 710 (storage device), a storage medium control IN unit 716, a storage medium 714, and an external IN unit 712. At least one of the barrier 706, the lens 702, and the aperture 704 is an optical device adapted for the apparatus. The barrier 706 protects the lens 702, and the lens 702 captures an optical image of an object onto the imaging device 70. The aperture 704 changes the amount of light that has passed through the lens 702. The imaging device 70 is configured as with the embodiments described above and converts an optical image captured by the lens 702 into image data (image signal). Herein, an analog-to-digital (AD) conversion unit is formed on a semiconductor substrate of the imaging device 70. The signal processing unit 708 performs various correction, data compression, or the like on imaging data output from the imaging device 70. The timing generation unit 720 outputs various timing signals to the imaging device 70 and the signal processing unit 708. The general control/operation unit 718 controls the overall digital still camera, and the memory unit 710 temporarily stores image data. The storage medium control IN unit 716 is an interface used for storage or reading of image data on the storage medium 714, and the storage medium 714 is a removable storage medium, such as a semiconductor memory used for storage or reading of imaging data. The external IN unit 712 is an interface used for communicating with an external computer or the like. A timing signal or the like may be input from the outside of the apparatus. Further, the apparatus 7 may include a display device (a monitor, an electronic view finder, or the like) that displays information obtained by the photoelectric conversion device. The apparatus includes at least the photoelectric conversion device. The apparatus 7 further includes at least any one of the optical device, the control device, the processing device, the display device, the storage device, and a mechanical device that operates based on information obtained by the photoelectric conversion device. The mechanical device is a movable unit (for example, a robot arm) that operates in response to a signal from the photoelectric conversion device.

While the imaging device 70 and the AD conversion unit are provided on the separate semiconductor substrates in the present embodiment, the imaging device 70 and the AD conversion unit may be formed on the same semiconductor substrate. Further, the imaging device 70 and the signal processing unit 708 may be formed on the same semiconductor substrate.

Further, each pixel may include a plurality of photoelectric conversion units (a first photoelectric conversion unit and a second photoelectric conversion unit) as with the fifth embodiment, for example. The signal processing unit 708 may be configured to process a pixel signal based on charges generated by the first photoelectric conversion unit and a pixel signal based on charges generated by the second photoelectric conversion unit and acquire distance information on the distance from the imaging device 70 to an object.

Eighth Embodiment

Figure 16A:
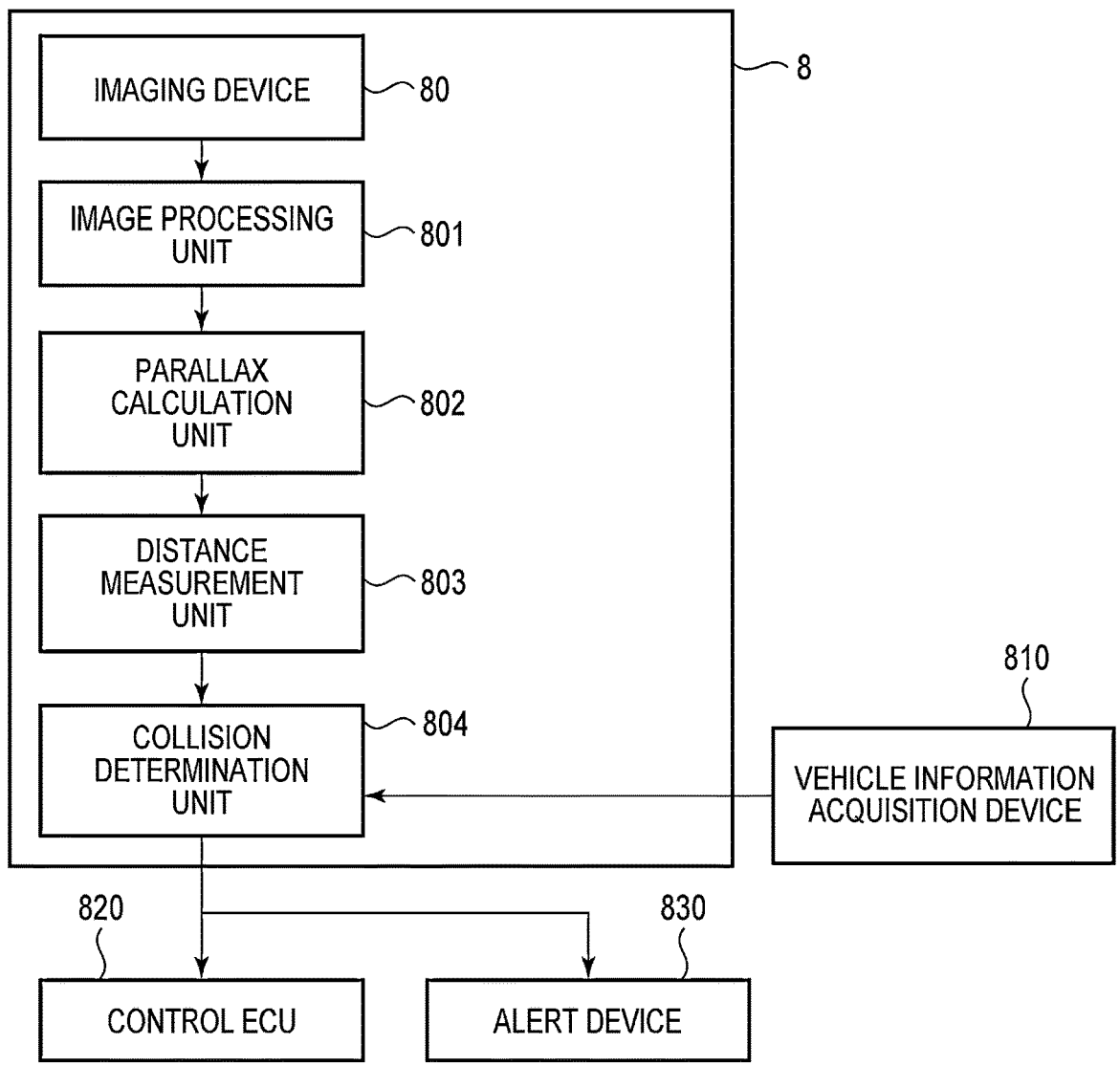
FIG. 16A and FIG. 16B are block diagrams of an apparatus according to a seventh embodiment.
Figure 16B:
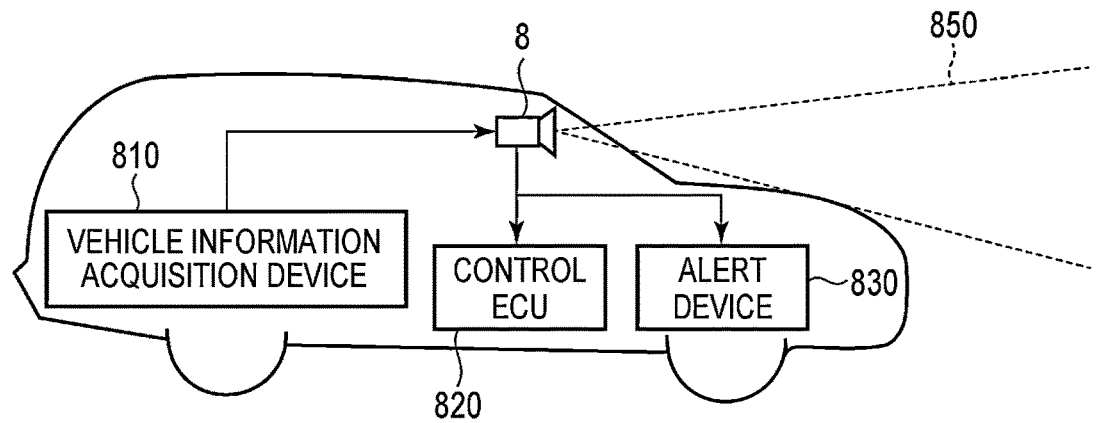

FIG. 16A and FIG. 16B are block diagrams of an apparatus related to an on-vehicle camera in the present embodiment. An apparatus 8 has an imaging device 80 (an example of the photoelectric conversion device) of any of the embodiments described above and a signal processing device (processing device) that processes signals from the imaging device 80. The apparatus 8 has an image processing unit 801 that performs image processing on a plurality of image data acquired by the imaging device 80 and a parallax calculation unit 802 that calculates a parallax (a phase difference of parallax images) from the plurality of image data acquired by the apparatus 8. Further, the apparatus 8 has a distance measurement unit 803 that calculates a distance to the object based on the calculated parallax and a collision determination unit 804 that determines whether or not there is a collision possibility based on the calculated distance. Here, the parallax calculation unit 802 and the distance measurement unit 803 represent an example of a distance information acquisition unit that acquires distance information on the distance to an object. That is, the distance information is information on a parallax, a defocus amount, a distance to an object, or the like. The collision determination unit 804 may use any of the distance information to determine the collision possibility. The distance information acquisition unit may be implemented by dedicatedly designed hardware or may be implemented by a software module. Further, the distance information acquisition unit may be implemented by a field programmable gate array (FPGA) or an application specific integrated circuit (ASIC) or may be implemented by a combination thereof.

The apparatus 8 is connected to the vehicle information acquisition device 810 and can acquire vehicle information, such as a vehicle speed, a yaw rate, a steering angle, or the like. Further, the apparatus 8 is connected to a control ECU 820, which is a control device that outputs a control signal for causing a vehicle to generate braking force based on a determination result from the collision determination unit 804. Further, the apparatus 8 is also connected to an alert device 830 that issues an alert to the driver based on a determination result from the collision determination unit 804. For example, when the determination result from the collision determination unit 804 indicates a high collision probability, the control ECU 820 performs vehicle control to avoid a collision or reduce damage by applying a brake, pushing back an accelerator, suppressing engine power, or the like. The alert device 830 alerts a user by sounding an alert, such as a sound, displaying alert information on a display of a car navigation system or the like, providing vibration to a seat belt or a steering wheel, or the like. The apparatus 8 functions as a control unit that controls the operation of controlling a vehicle as described above.

In the present embodiment, an area around a vehicle, for example, an image of the front area or the rear area is captured by using the apparatus 8. FIG. 16B illustrates the apparatus when an image of the front area of a vehicle (a capturing area 850) is captured. The vehicle information acquisition device 810 as an imaging control unit instructs the apparatus 8 or the imaging device 80 to perform an imaging operation. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the apparatus is not limited to a vehicle, such as an automobile and can be applied to a movable body (movable apparatus), such as a ship, an airplane, a satellite, an industrial robot and a consumer use robot, or the like, for example. In addition, the apparatus can be widely applied to an apparatus which utilizes object recognition or biometric authentication, such as an intelligent transportation system (ITS), a surveillance system, or the like without being limited to movable bodies.

Modified Embodiments

The present disclosure can be modified in various ways and is not limited to the embodiments described above. For example, an example in which a configuration of a part of any of the embodiments is added to another embodiment or an example in which a configuration of a part of any of the embodiments is replaced with a configuration of a part of another embodiment is also one of the embodiments of the present disclosure.

Some embodiments can also be realized by a computer of a system or apparatus that reads out and executes computer-executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer-executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer-executable instructions. The computer-executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2021-060266, which was filed on Mar. 31, 2021 and which is hereby incorporated by reference herein in its entirety.

What is claimed is:

1. A photoelectric conversion device comprising:
a pixel array including a first pixel and a second pixel;
a scanning circuit that outputs a control signal to the pixel array; and
an output line connected to the first pixel and the second pixel,
wherein the first pixel includes a photoelectric conversion unit including a first semiconductor region of a first conductivity type as a charge accumulation layer and photoelectrically converts incident light to output a signal in accordance with the incident light to the output line, and
wherein the second pixel includes
a second semiconductor region of the first conductivity type,
a transistor including a first main electrode formed by a third semiconductor region connected to the second semiconductor region, a gate connected to the scanning circuit, and a second main electrode formed by a fourth semiconductor region,
a first contact connected between the fourth semiconductor region and the output line, and
a second contact supplied with a power source potential and connected to the third semiconductor region.

2. The photoelectric conversion device according to claim 1, wherein the pixel array includes a first pixel region in which a plurality of first pixels are arranged so as to form a plurality of rows and a plurality of columns and a second pixel region that is provided outside the first pixel region and in which the second pixel is arranged.

3. The photoelectric conversion device according to claim 2, wherein the pixel array further includes a third pixel region including a third pixel that includes a light-shielded photoelectric conversion unit and outputs a black level signal.

4. The photoelectric conversion device according to claim 3, wherein the second pixel region is arranged in an outer circumference of the third pixel region.

5. The photoelectric conversion device according to claim 3, wherein the second pixel region is arranged so as to surround the first pixel region and the third pixel region.

6. The photoelectric conversion device according to claim 3, wherein the second pixel region is arranged between the first pixel region and the third pixel region.

7. The photoelectric conversion device according to claim 1, wherein the first semiconductor region and the second semiconductor region have the same shape in plan view.

8. The photoelectric conversion device according to claim 1, wherein an impurity concentration of the third semiconductor region is higher than an impurity concentration of the second semiconductor region.

9. The photoelectric conversion device according to claim 1, wherein the first pixel includes a plurality of photoelectric conversion units that light passing through a single microlens enters.

10. The photoelectric conversion device according to claim 1,
wherein the first pixel includes
the photoelectric conversion unit,
a first node supplied with charges from the photoelectric conversion unit,
an amplifier transistor that outputs a signal in accordance with a voltage of the first node, and
a first transistor that opens and closes a path between the first node and a second node not included in a path from the photoelectric conversion unit to the first node, and
wherein when the first transistor is conducted, a capacitance is added to the first node.

11. The photoelectric conversion device according to claim 1,
wherein the first pixel includes
the photoelectric conversion unit,
a first node supplied with charges from the photoelectric conversion unit,
an amplifier transistor that outputs a signal in accordance with a voltage of the first node,
a first transistor that opens and closes a path between the first node and a second node not included in a path from the photoelectric conversion unit to the first node, and
a second transistor that opens and closes a path between the second node and a third node, and
wherein a second capacitance added to the second node when the second transistor is conducted is larger than a first capacitance added to the first node when the first transistor is conducted.

12. An apparatus comprising:
the photoelectric conversion device according to claim 1; and
at least any one of:
an optical device adapted for the photoelectric conversion device,
a control device configured to control the photoelectric conversion device,
a processing device configured to process a signal output from the photoelectric conversion device,
a display device configured to display information obtained by the photoelectric conversion device,
a storage device configured to store information obtained by the photoelectric conversion device, and
a mechanical device configured to operate based on information obtained by the photoelectric conversion device.

13. The apparatus according to claim 12, wherein the processing device processes image signals generated by a plurality of photoelectric conversion units, respectively, and acquires distance information on a distance from the photoelectric conversion device to an object.

* * * * *